(12) United States Patent
Kumar et al.

(10) Patent No.: US 9,698,176 B1
(45) Date of Patent: Jul. 4, 2017

(54) SILICON-BASED BACKPLANE STRUCTURES AND METHODS FOR DISPLAY APPLICATIONS

(71) Applicants: Ananda H. Kumar, Fremont, CA (US); Srinivas H. Kumar, Fremont, CA (US); Tue Nguyen, Fremont, CA (US)

(72) Inventors: Ananda H. Kumar, Fremont, CA (US); Srinivas H. Kumar, Fremont, CA (US); Tue Nguyen, Fremont, CA (US)

(*) Notice: Subject to any disclaimer, the term of this patent is extended or adjusted under 35 U.S.C. 154(b) by 0 days.

(21) Appl. No.: 14/533,107

(22) Filed: Nov. 5, 2014

Related U.S. Application Data

(60) Provisional application No. 61/900,368, filed on Nov. 5, 2013, provisional application No. 61/921,089, filed on Dec. 27, 2013.

(51) Int. Cl.
| | | |
|---|---|---|
| *H01L 51/00* | (2006.01) | |
| *H01L 21/20* | (2006.01) | |
| *H01L 27/12* | (2006.01) | |
| *H01L 21/762* | (2006.01) | |
| *H01L 27/32* | (2006.01) | |
| *H01L 51/56* | (2006.01) | |

(52) U.S. Cl.
CPC ...... *H01L 27/127* (2013.01); *H01L 21/76254* (2013.01); *H01L 27/1229* (2013.01); *H01L 27/3244* (2013.01); *H01L 51/56* (2013.01); *H01L 2227/323* (2013.01)

(58) Field of Classification Search
CPC ............... H01L 27/127; H01L 27/1229; H01L 27/3244; H01L 51/56; H01L 21/76254
See application file for complete search history.

(56) References Cited

U.S. PATENT DOCUMENTS

| | | | | |
|---|---|---|---|---|
| 7,859,510 B2* | 12/2010 | Umezaki | ................ | G09G 3/342 345/100 |
| 8,716,708 B2* | 5/2014 | Yamazaki et al. | .............. | 257/43 |
| 2001/0026125 A1* | 10/2001 | Yamazaki et al. | ............ | 313/505 |
| 2004/0061176 A1* | 4/2004 | Takafuji et al. | ............... | 257/347 |
| 2005/0007316 A1* | 1/2005 | Akimoto et al. | ................ | 345/76 |
| 2008/0062112 A1* | 3/2008 | Umezaki | ................ | G09G 3/342 345/100 |
| 2010/0327285 A1* | 12/2010 | Yamamoto | .......... | H01L 27/1281 257/59 |

\* cited by examiner

*Primary Examiner* — Seahvosh Nikmanesh
(74) *Attorney, Agent, or Firm* — Tue Nguyen

(57) ABSTRACT

Displays can be fabricated using driver transistors formed with high quality semiconductor channel materials, and switching transistors formed with low quality semiconductor channel materials. The driver transistors can require high forward current to drive emission of the OLED pixels, but might not require very low leakage current. The switching transistors can require low leakage current to allow the pixel capacitor to retain the signal level for accurate OLED device emission, preventing abnormal displays or cross talks.

20 Claims, 29 Drawing Sheets

SILICON-BASED BACKPLANE STRUCTURES AND METHODS FOR DISPLAY APPLICATIONS

The present application claims priority from and U.S. Provisional Patent Application Ser. No. 61/900,368, filed on Nov. 5, 2013 entitled: "Fabrication of single crystal silicon structures by epitaxial deposition" and U.S. Provisional Patent Application Ser. No. 61/921,089, filed on Dec. 27, 2013, entitled: "Novel silicon-based backplane structures and methods for display applications" all of which are incorporated herein by reference.

BACKGROUND

Backplanes are the brains of displays. Amorphous silicon (a-Si) is used for over 90% of flat panel displays (FPD) even to this day, and has established a solid manufacturing infrastructure including the technology advancements that has developed in the past decade. Due to its very low electron mobility (1 $cm^2$/V-s), it is not suitable for high performance LCDs and OLED displays in today's mobile devices with higher resolution TFT-LCD and AMOLED.

Low Temperature Polycrystalline Silicon (LTPS) can be used as the available backplane technology for these applications. LTPS is built on the a-Si technology in several respects, such as LTPS is formed by low temperature re-crystallization of a-Si. In addition, LTPS can have many commonalities with a-Si, such as device design, processing, reliability historical data, and potentially low costs. Its electron mobility is about 50 $cm^2$/V-s, much higher that of a-Si.

High resolution TFT-AMLCD or AMOLED displays can require high mobility transistors, which can be fabricated using Low Temperature Poly-Silicon (LTPS). The fabrication of LTPS backplanes requires a laser annealing step. LTPS backplanes can require additional transistors to correct the non-uniformity caused by the finite grain size of silicon in the LTPS. Another limitation of LTPS is the high off-state leakage current, also caused by the presence of grain boundaries. Voltage drift over time, again attributed to the presence of grain boundaries in LTPS, is another problem associated with LTPS. Thus it can be difficult to develop an economical process for making LTPS transistor arrays.

Recently, new processes and materials have been developed. For example, Indium Gallium Zinc Oxide (IGZO) can be used as the channel material for the transistors in the back plane. Since indium and gallium are scarce and expensive materials, IGZO-based back plane can be expensive.

SiOG process, which includes a single crystal silicon layer on a glass substrate, has been proposed for use as backplane for high performance mobile display applications. Its high electron mobility, greater than 500 $cm^2$/V-s, attributable to its single crystal nature, will be a great benefit to backplane applications. The single crystal silicon-on glass substrate can be prepared by first implanting hydrogen into a silicon wafer with sufficient energy and fluence, forming a defect plane that can be used to exfoliate the top portion of the wafer. A glass sheet can be attached to the implanted wafer, for example, by stiction at room temperature. The composite structure can be heated, for example, on a hot plate, to exfoliate a thin silicon layer attached to glass. The bonding of the thin silicon to the glass substrate can be strengthened by heating to a higher temperatures or by anodic bonding.

SIOG shows promises for backplane applications, providing all the expected benefits of "a single crystal CMOS-type TFT" for OLED displays, including the benefits of electron mobility in excess of 500 $cm^2$/V-s, together with the ability to integrate drivers and other circuits, lower power consumption, greater resolution, higher speed, better uniformity, lower nose, higher brightness displays. SiOG transistors can be better than LTPS transistors in all of the above characteristics, and can be nearly equivalent to those made on SOI.

A potential problem for SIOG transistors is its high current leakage in the OFF position, e.g., higher by two orders of magnitude as compared to a-Si or LTPS transistors. Its behaviors can also be worse in terms of 1/f noise as compared to SOI.

SUMMARY OF THE EMBODIMENTS

In some embodiments, the present invention discloses methods and systems to achieve high on-state current, comparable with SOI structures, together with low off-state leakage current, comparable with a-Si or LTPS structures.

In some embodiments, the present invention discloses methods and systems that combine the benefits of good quality semiconductor materials with the benefits of low quality semiconductor materials, such as single crystal silicon/amorphous silicon pair, polycrystalline silicon/amorphous silicon pair, aligned IGZO/amorphous IGZO pair, in a such way that the on-state current comes the high quality semiconductor materials while the off-state current is from the low quality semiconductor materials.

In some embodiments, the present invention discloses displays having driver transistors formed with high quality silicon channel, such as single crystal silicon transistors, and switching transistors formed with low quality silicon channel, such as a-Si transistors. The driver transistors can cause currents to flow to the pixels, e.g., OLED pixels for emission. The switching transistors can relay the gray scale signal to the pixels. The driver transistors can require high forward current to drive emission of the OLED pixels, but might not require very low leakage current. The switching transistors can require low leakage current to allow the pixel capacitor to retain the signal level for accurate OLED device emission, preventing abnormal displays or cross talks.

In some embodiments, the present invention discloses a display having driver transistors and switching transistors with the driver transistors having higher forward current and higher leakage current characteristics than the switching transistors. For example, the driver and switching transistors can be formed from two types of silicon channel, such as single crystal silicon and polycrystalline silicon, single crystal silicon and amorphous silicon, or polycrystalline silicon and amorphous silicon.

DETAILED DESCRIPTION OF THE EMBODIMENTS

Figure 1A:
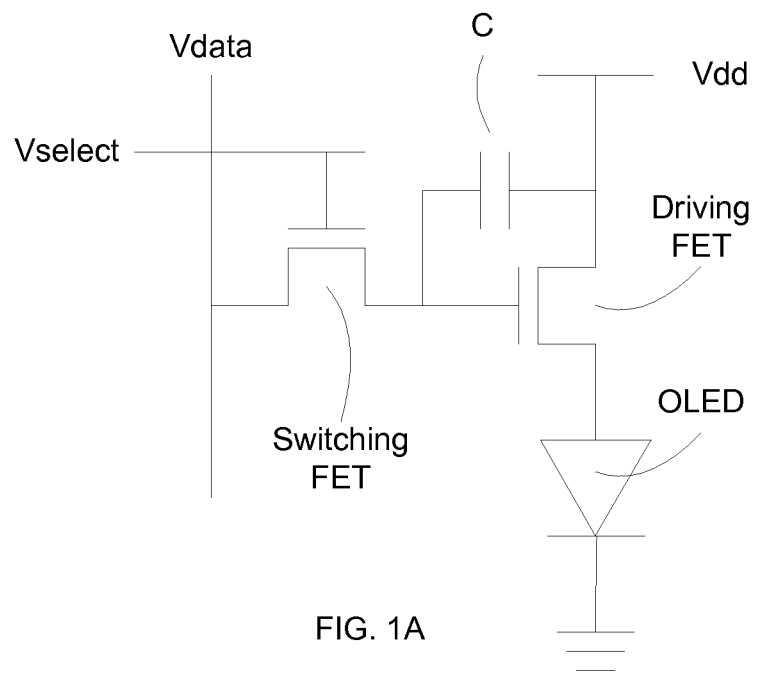
FIGS. 1A-1B illustrate an OLED display pixel according to some embodiments.
Figure 1B:
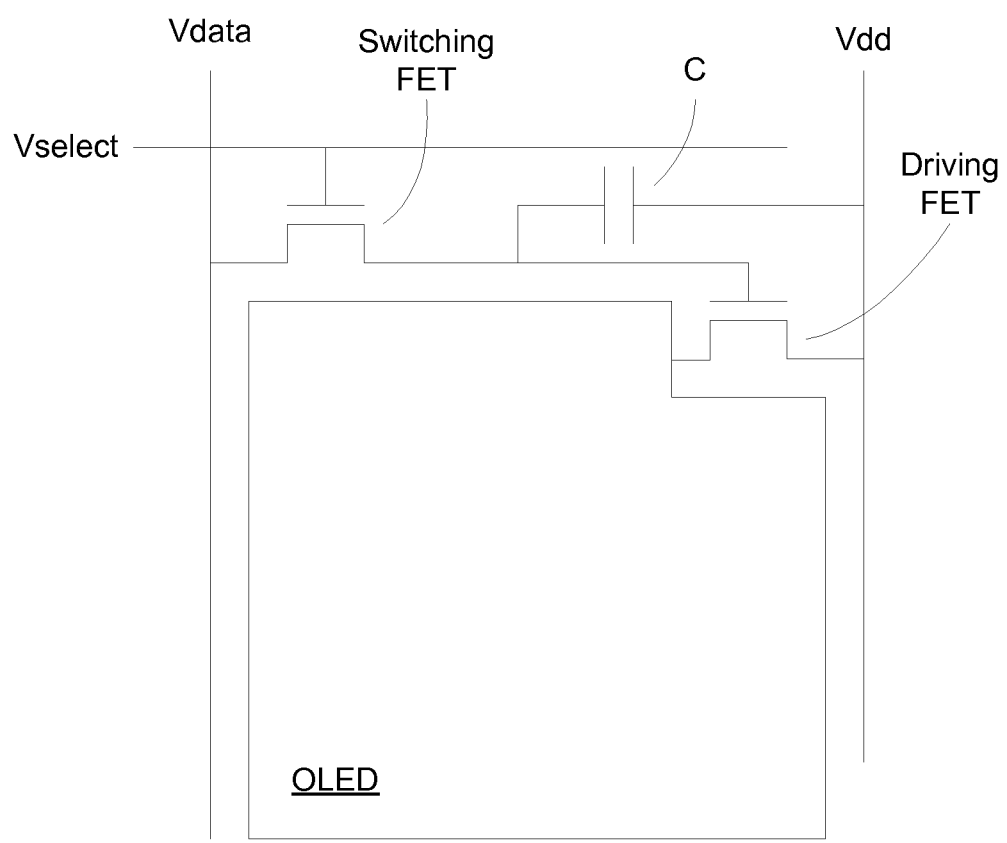

FIGS. 1A-1B illustrate an OLED display pixel according to some embodiments. The figures show an OLED pixel, but other types of display pixels can be used, such as LCD pixels. An OLED pixel can be represented by a diode, which requires a high current for light emission. A driver transistor (e.g., driver FET) can be coupled to the OLED pixel to control the current through the OLED pixel. Power supply Vdd can be used to supply power to the driver transistor. A switching transistor (e.g., switching FET) can be used to control the driver transistor. Vdata and Vselect can be coupled to the source (or drain) and gate of the switching transistor, for example, to provide pixel selection.

Figure 2:
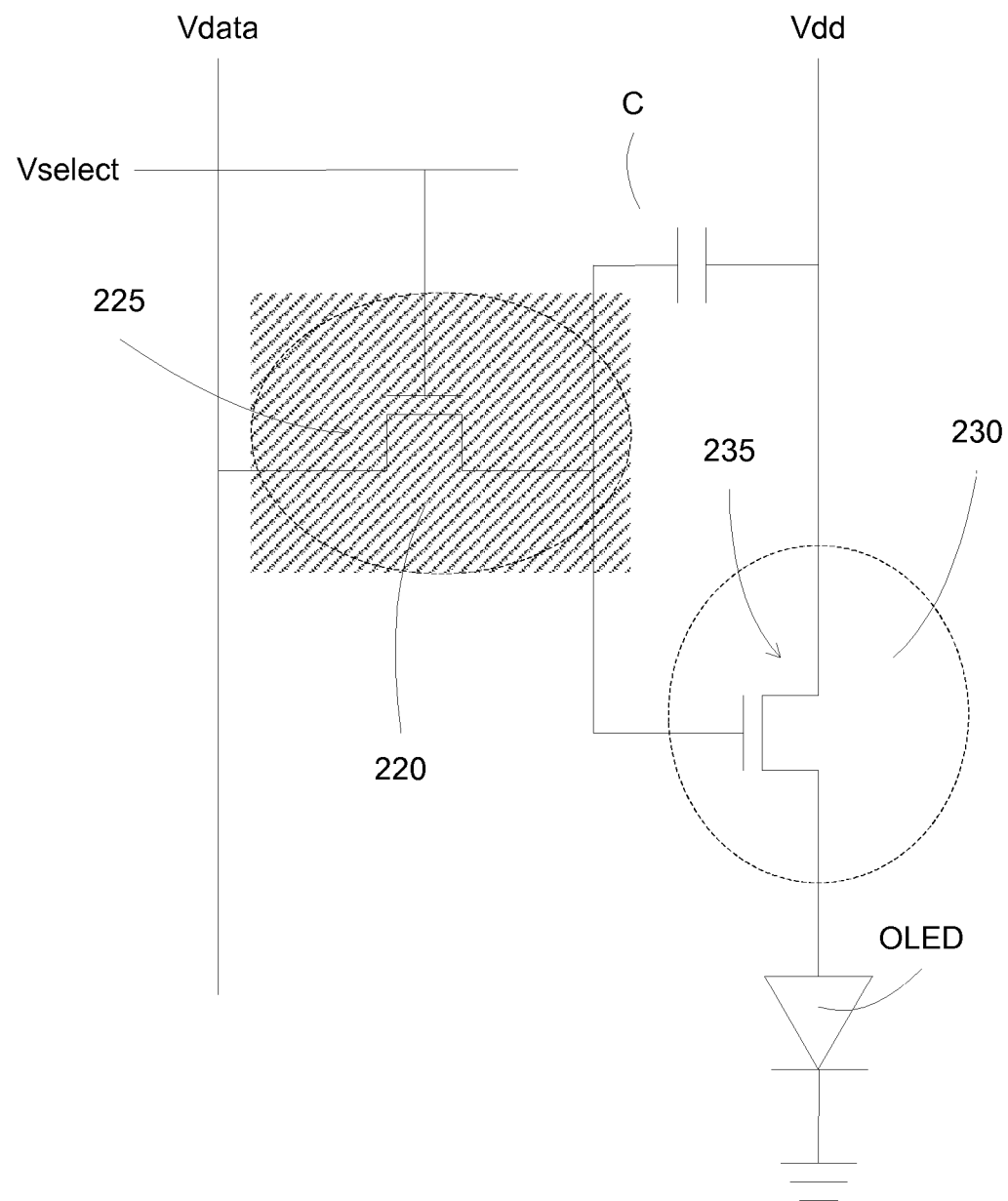
FIG. 2 illustrates an OLED display pixel according to some embodiments.

FIG. 2 illustrates an OLED display pixel according to some embodiments. The driver transistor 235 and the switching transistor 225 can be fabricated using different silicon channel, such as fabricated on different areas 230 and 220, respectively. For example, the driver transistor 235 can be fabricated on a single crystal silicon area 230. The driver transistor can be fabricated using SOI processes. The switching transistor 225 can be fabricated on a substrate area 220, such as the glass substrate, with the channel deposited as an amorphous silicon layer. The switching transistor can be fabricated using thin film transistor processes. Alternatively, the switching transistor 225 can be fabricated on a single crystal silicon area, but the channel includes amorphous or polycrystalline silicon, deposited on the single crystal silicon area.

Figure 3A:
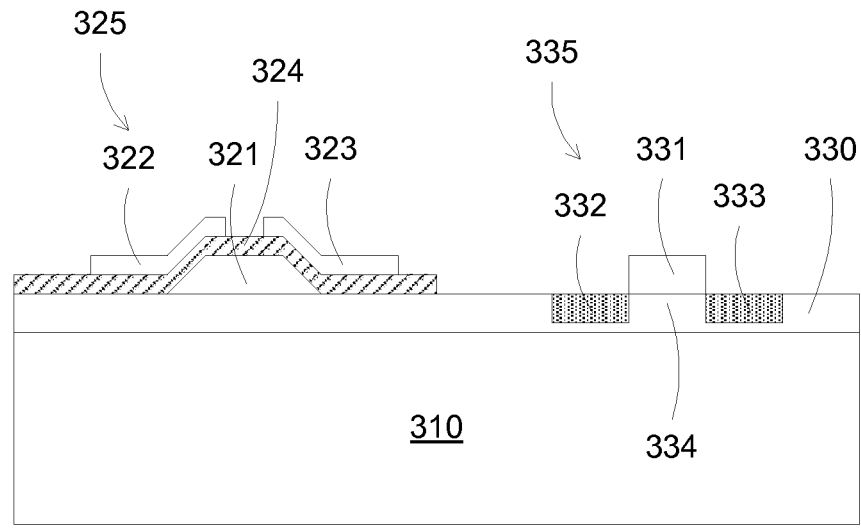
FIGS. 3A-3B illustrate cross section of driver and switching transistors according to some embodiments.
Figure 3B:
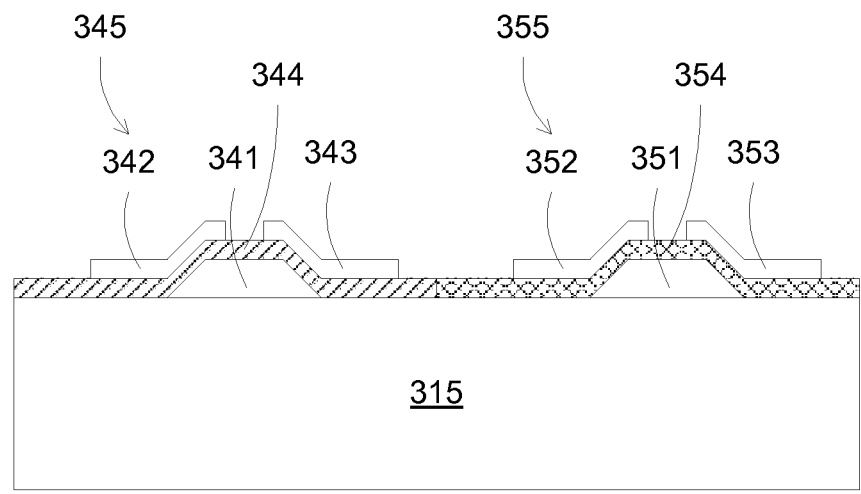

FIGS. 3A-3B illustrate cross section of driver and switching transistors according to some embodiments. In FIG. 3A, a single crystal silicon transistor 335 can be formed together with an amorphous (or polycrystalline) silicon transistor 325. The single crystal silicon transistor 335 can be used as a driver transistor for a display pixel. The amorphous (or polycrystalline) silicon transistor 325 can be used as a switching transistor for the display pixel (e.g., for controlling the driver transistor which supplies current to the pixel).

Transistor 335 can be formed on a single crystal silicon layer 330, which can be formed on a substrate 310. Source and drain 332 and 333 can be formed in the silicon layer 330. Gate 331 can be formed between the source and drain regions, to control current through single crystal silicon channel 334. Transistor 325 can be formed on the single crystal silicon layer 330. Gate 321 can be formed on layer 330. An amorphous silicon layer 324 can be deposited on the gate 321. Source and drain 322 and 323 can be formed on the amorphous silicon layer 324.

Other configurations can be used. For example, the transistor 325 can be formed on the substrate 310 instead of on the silicon layer 330. Other transistor configurations for the single crystal silicon transistor 335 or for the amorphous silicon transistor 325 can be used.

In FIG. 3B, a polycrystalline silicon transistor 355 can be formed together with an amorphous silicon transistor 345. The polycrystalline silicon transistor 355 can be used as a driver transistor for a display pixel. The amorphous silicon transistor 345 can be used as a switching transistor for the display pixel (e.g., for controlling the driver transistor which supplies current to the pixel).

Transistor 345 can be formed on the substrate 315. Gate 341 can be formed on substrate 315. An amorphous silicon layer 344 can be deposited on the gate 341. Source and drain 342 and 343 can be formed on the amorphous silicon layer 344. Transistor 355 can be formed on the substrate 315. Gate 351 can be formed on substrate 315. An amorphous silicon layer can be deposited on the gate 351, and then laser annealed to form a polycrystalline silicon layer 354. Source and drain 352 and 353 can be formed on the polycrystalline silicon layer 354.

Figure 4:
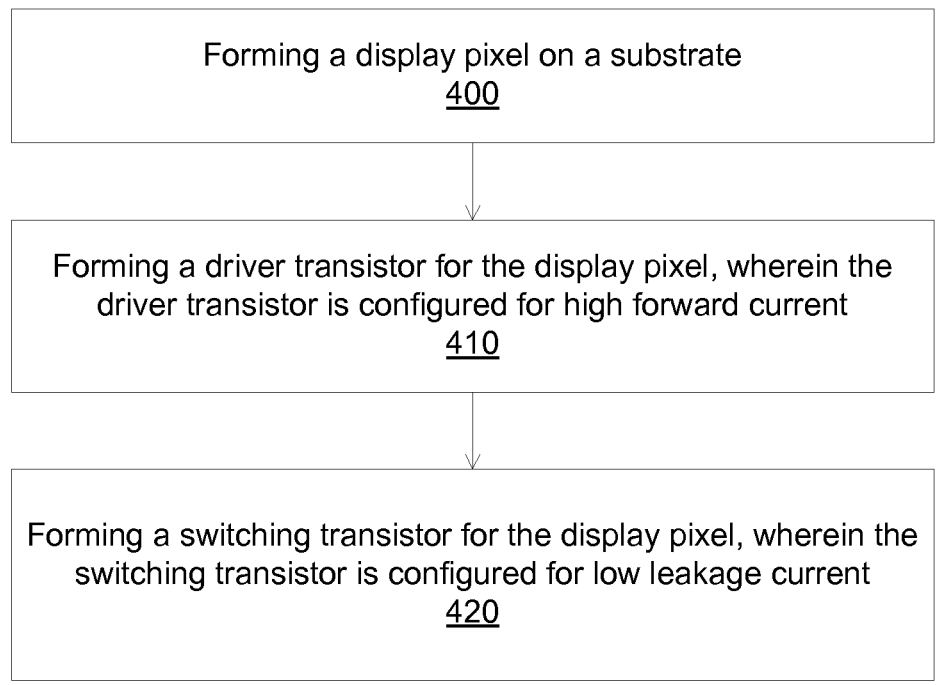
FIG. 4 illustrates a flow chart for forming a pixel circuit of a display according to some embodiments.

FIG. 4 illustrates a flow chart for forming a pixel circuit of a display according to some embodiments. Operation 400 forms a display pixel on a substrate, such as a glass substrate. The display pixel can be a LCD pixel or an OLED pixel. Operation 410 forms driver transistor for the display pixel. The driver transistor is configured for high forward current. For example, the driver transistor can be a single crystal silicon transistor, e.g., a transistor having a single crystal silicon channel, or a transistor formed on a single crystal silicon layer. In some embodiments, the driver transistor can be a polycrystalline silicon transistor, e.g., a transistor having a polycrystalline silicon channel, if the switching transistor is an amorphous silicon transistor.

Operation 420 forms switching transistor for the display pixel, e.g., to control the current through the driver transistor which supplies to the pixel. The switching transistor is configured for low leakage current, e.g., low off-state current. For example, the switching transistor can be an amorphous silicon transistor, e.g., a transistor having an amorphous silicon channel. In some embodiments, the switching transistor can be a polycrystalline silicon transistor, e.g., a transistor having a polycrystalline silicon channel, if the driver transistor is a single crystal silicon transistor.

The operations can be performed in any sequences, for example, forming the transistors before forming the pixel, or forming the driver transistor before or after forming the switching transistor.

A single crystal silicon layer can be formed on a substrate by a hydrogen-ion implant method or an epitaxial growth on porous silicon. Single crystal silicon transistor can be fabricated on the single crystal silicon layer. The amorphous or polycrystalline silicon transistor can be formed on the substrate by depositing an amorphous silicon layer (for amorphous silicon transistor) and laser annealed (for polycrystalline silicon transistor).

Figure 5A:
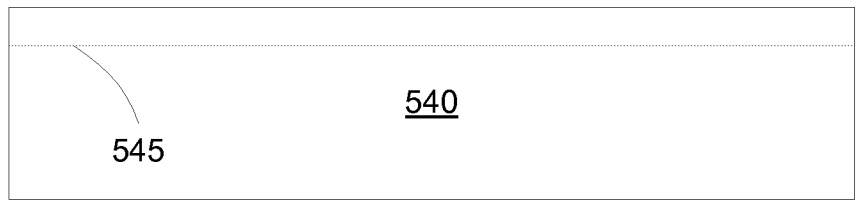
FIGS. 5A-5C illustrate a process flow for forming a single crystal silicon layer on a substrate by a hydrogen ion implantation process according to some embodiments.
Figure 5B:
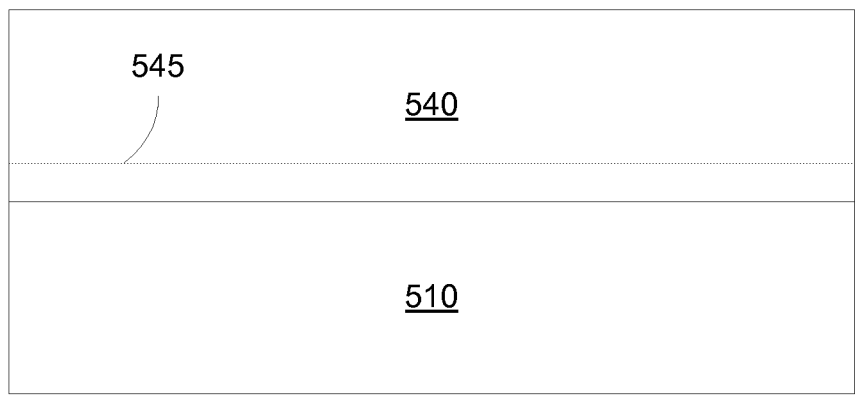
Figure 5C:

FIGS. 5A-5C illustrate a process flow for forming a single crystal silicon layer on a substrate by a hydrogen ion implantation process according to some embodiments. In FIG. 5A, an oxidized single crystal silicon wafer 540 is implanted with H or $H_2$ to suitable dosage and energy level to a desired depth 545, e.g., between 0.2 to 5 microns. In FIG. 5B, wafer 540 is mated with a glass substrate 510 to form a temporary bond. In FIG. 5C, the composite substrate of wafer 540 and glass substrate 510 is heated, e.g., on a hot plate, to exfoliate silicon-on-glass. The wafer 540 is separated at the implanted plane 545A, forming a silicon layer 540A which is bonded to the glass substrate 510, and a remaining wafer portion 540B. The remaining wafer portion 540B can be reused.

The single crystal silicon layer 540A can be used to form single crystal silicon transistors, e.g., driver transistor for the display pixels. The thickness of the single crystal silicon layer 540A can be between 0.2 and 5 microns.

Figure 6A:
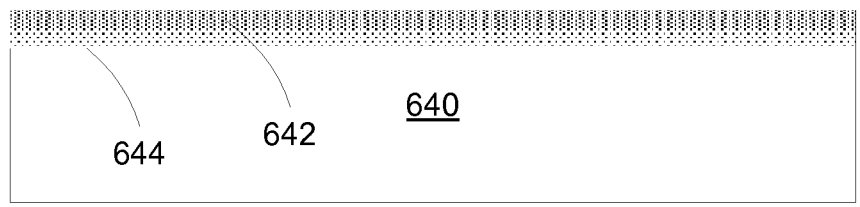
FIGS. 6A-6D illustrate a process flow for forming a single crystal silicon layer on a substrate by an epitaxial growth on porous silicon process according to some embodiments.
Figure 6B:
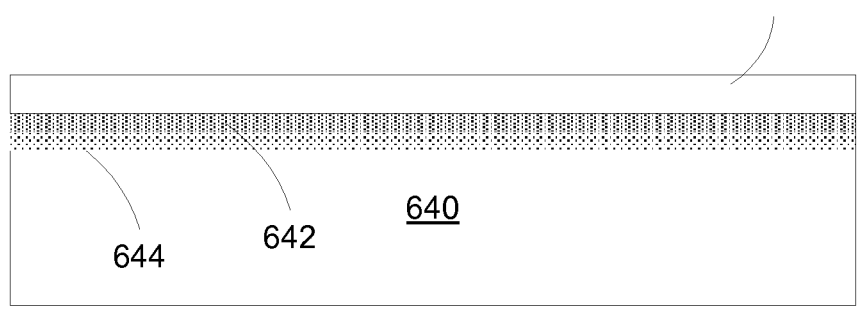
Figure 6C:
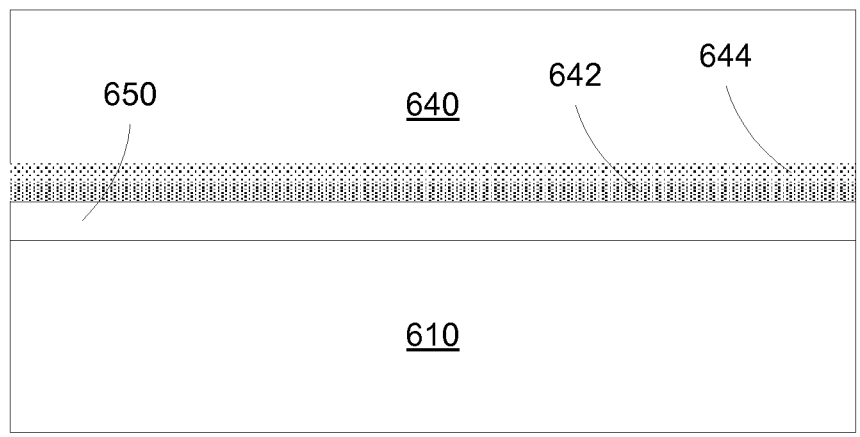
Figure 6D:
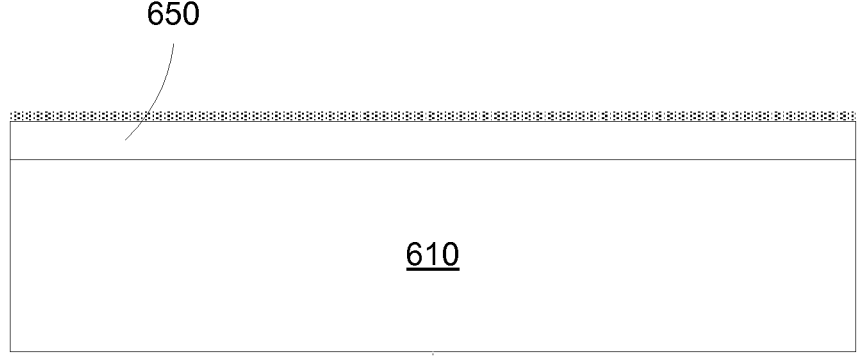

FIGS. 6A-6D illustrate a process flow for forming a single crystal silicon layer on a substrate by an epitaxial growth on porous silicon process according to some embodiments. A silicon layer can be grown epitaxially on a porous silicon wafer, which is formed by anodic etching in hydrofluoric acid using platinum wire mesh or graphite as cathode. In FIG. 6A, two level porous silicon layer 642/644 is formed on a silicon wafer 640 by anodic etching in hydrofluoric acid. The total thickness of the two level porous silicon layer 642/644 can be between 0.5 to 2 microns, such as around 1 micron. Platinum or graphite electrodes can be used as cathode in the anodic etching process. In some embodiments, the silicon wafer 640 is partially conductive, for example, by doping with boron. In FIG. 6B, a single crystal silicon layer 650 is grown epitaxially on the top denser porous silicon layer 642, e.g., using tri-chloro-silane and hydrogen at above 1000 C. In FIG. 6C, the silicon wafer 640 having the epitaxial silicon layer 650 is intimately mated to a glass substrate 610, for example, after cooling. In FIG. 6D, the thin epitaxial single crystal silicon layer 650 is exfoliated by heating on a hot plate, forming a glass substrate 610 having a single crystal silicon layer 650 on a top surface. Optionally, the silicon-on-glass is heated to a higher temperature to strengthen the bonding between the single silicon layer 650 and the glass substrate 610.

The single crystal silicon layer 650 can be used to form single crystal silicon transistors, e.g., driver transistor for the display pixels. The thickness of the single crystal silicon layer 650 can be between 0.2 and 5 microns.

Figure 7A:
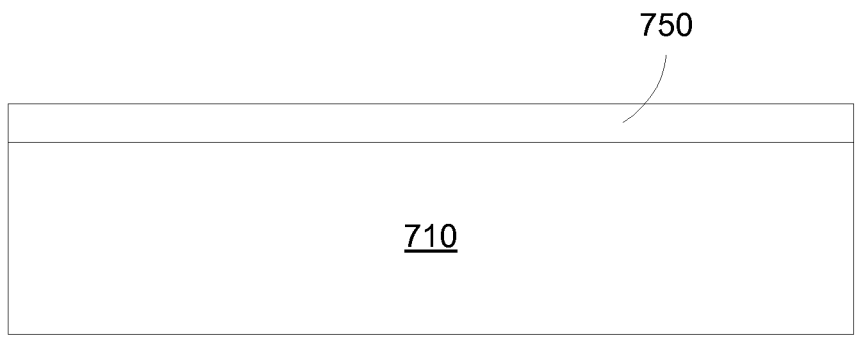
FIGS. 7A-7C illustrate a process of forming two different transistors on a substrate according to some embodiments.
Figure 7B:
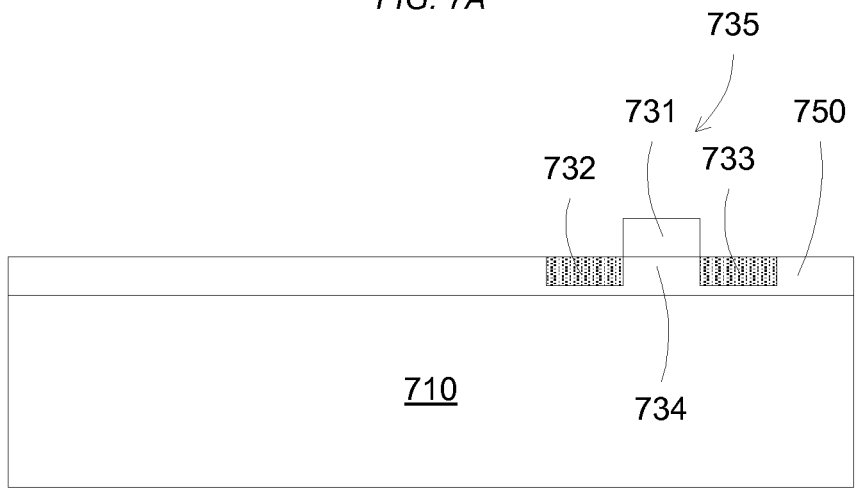
Figure 7C:
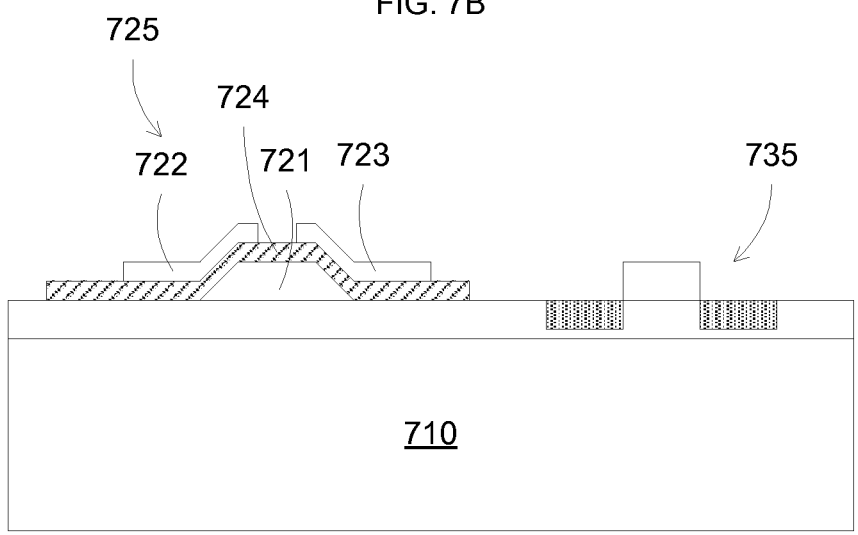

FIGS. 7A-7C illustrate a process of forming two different transistors on a substrate according to some embodiments. Two transistors can be formed side by side on a glass substrate, one made in the SiOG layer to be used as the driver transistor and the other made in the a-Si layer to be used as the switching transistor of the pixel.

In FIG. 7A, a SiOG (silicon on glass) substrate can be provided, having a single crystal silicon layer 750 on a glass substrate 710. The SiOG substrate can be prepared using an implantation process or an anodic etching process as discussed above. The starting SiOG substrate of this invention may be an industry standard large glass sheet, for example Eagle XG glass made by Corning, on to which are bonded multiple thin single crystal silicon layers, transferred in a tiled fashion to cover its entire area. An optional oxide layer can be formed on the single crystal silicon layer 750. In FIG. 7B, single crystal silicon transistor 735 can be formed on the single crystal silicon layer 750, including forming source/drain 732/733 and gate 731 on single crystal silicon channel 734. In FIG. 7C, amorphous (or polycrystalline) silicon transistor 725 can be formed on the single crystal silicon layer 750 (also on an optional oxide layer). The transistor 725 includes a gate 721, an amorphous (or polycrystalline) silicon layer 724, and source and drain layers 722 and 723. The amorphous silicon layer can be between 10 and 50 nm thick. Interconnects can be added to form circuits to operate display pixels.

Other sequences can be used, such as forming the amorphous or polycrystalline silicon transistor before forming the single crystal silicon transistor.

Figure 8A:
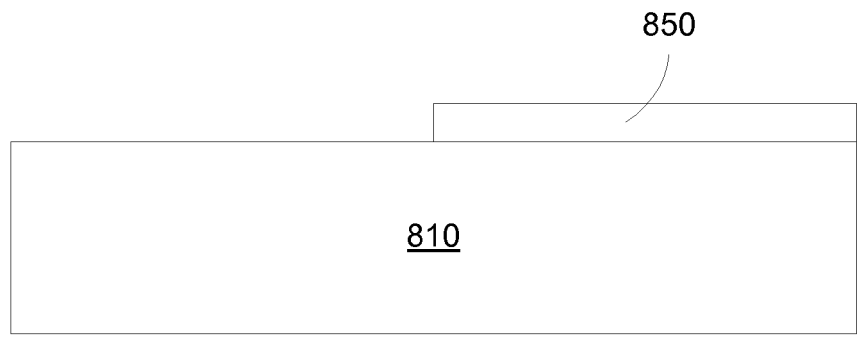
FIGS. 8A-8C illustrate a process of forming two different transistors on a substrate according to some embodiments.
Figure 8B:
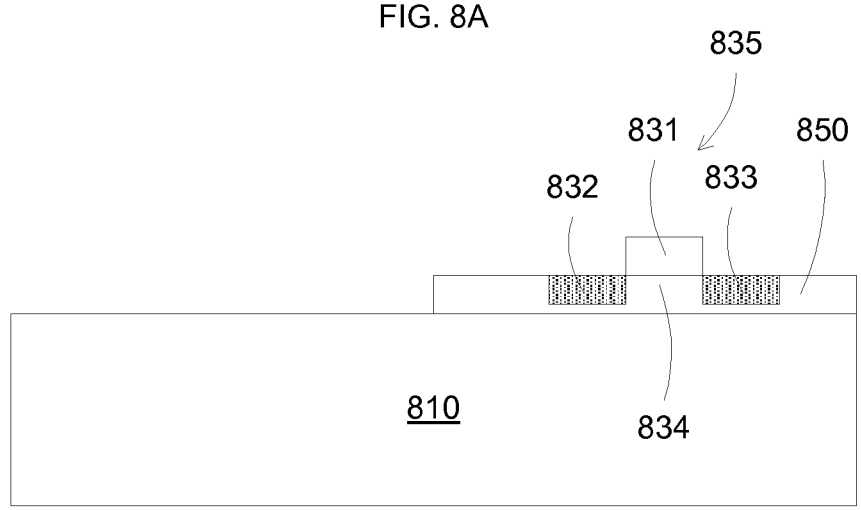
Figure 8C:
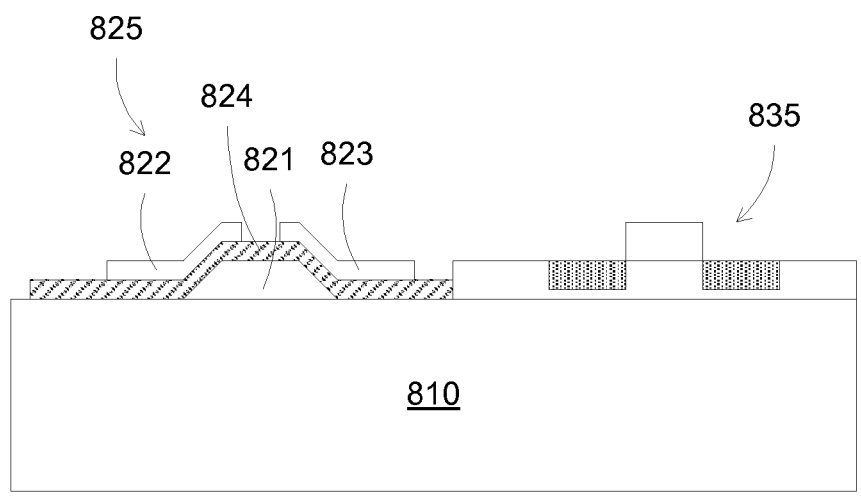

FIGS. 8A-8C illustrate a process of forming two different transistors on a substrate according to some embodiments. In FIG. 8A, a SiOG (silicon on glass) substrate can be provided, having a single crystal silicon layer 850 on a glass substrate 810. The single crystal silicon layer 850 can be patterned, for example, to remove portions of the layer that are not needed in making single crystal silicon transistors. For example, at areas used for forming amorphous or polycrystalline silicon transistors, the single crystal silicon layer can be removed. In FIG. 8B, single crystal silicon transistor 835 can be formed on the single crystal silicon layer 850, including forming source/drain 832/833 and gate 831 on single crystal silicon channel 834. In FIG. 8C, amorphous (or polycrystalline) silicon transistor 825 can be formed on the substrate 810 (also on an optional oxide layer). The transistor 825 includes a gate 821, an amorphous (or polycrystalline) silicon layer 824, and source and drain layers 822 and 823. The amorphous silicon layer can be between 100 and 1000 nm thick. Interconnects can be added to form circuits to operate display pixels.

Other sequences can be used, such as forming the amorphous or polycrystalline silicon transistor before forming the single crystal silicon transistor.

Figure 9:
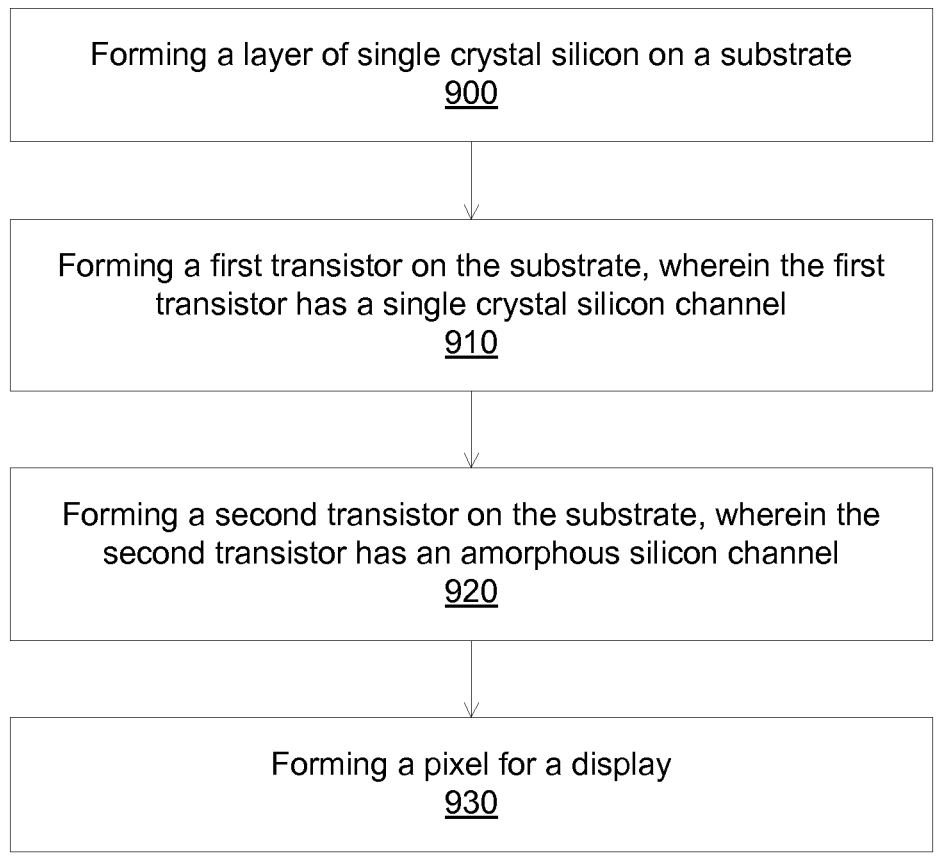
FIG. 9 illustrates a flow chart for forming a display according to some embodiments.

FIG. 9 illustrates a flow chart for forming a display according to some embodiments. Operation 900 forms a single crystal silicon layer on a substrate, such as a glass substrate. Operation 910 forms a first transistor on the substrate. The first transistor has a single crystal silicon channel, for example, by formed on the single crystal silicon layer. Operation 920 forms a second transistor on the substrate. The second transistor has an amorphous or polycrystalline silicon channel, for example, by depositing an amorphous silicon layer with optional laser anneal. Operation 930 forms pixels for the display. Other sequences can be used, such as the pixels can be formed before the transistors, or the amorphous or polycrystalline silicon transistor before the single crystal silicon transistor.

Figure 10:
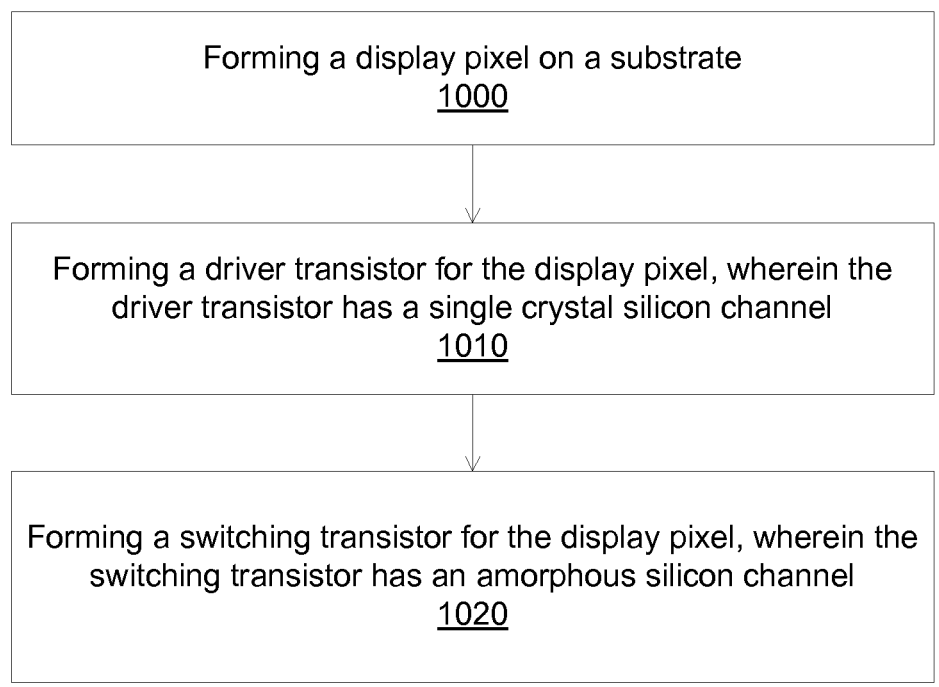
FIG. 10 illustrates a flow chart for forming a display according to some embodiments.

FIG. 10 illustrates a flow chart for forming a display according to some embodiments. Operation 1000 forms a display pixel on a substrate. Operation 1010 forms a driver transistor for the display pixel. The driver transistor has a single crystal silicon channel, for example, by formed on a single crystal silicon layer. Operation 1020 forms a switching transistor for the display pixel, such as for switching the driver transistor which can supply current to the pixel. The switching transistor has an amorphous or polycrystalline silicon channel, for example, by depositing an amorphous silicon layer with optional laser anneal. Other sequences can be used, such as the pixels can be formed after the transistors, or the amorphous or polycrystalline silicon transistor before the single crystal silicon transistor.

In some embodiments, amorphous and polycrystalline silicon transistors can be used as switching and driver transistors for display pixels. The polycrystalline silicon transistors can have high forward current, which is suitable for driving the pixels. The amorphous silicon transistors can be low leakage current, which is suitable for switching the pixel, for example, through the driver transistors.

Figure 11A:
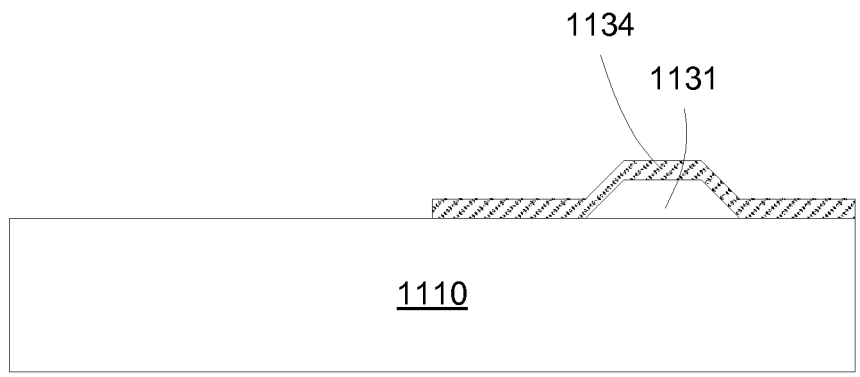
FIGS. 11A-11C illustrate a process of forming two different transistors on a substrate according to some embodiments.
Figure 11B:
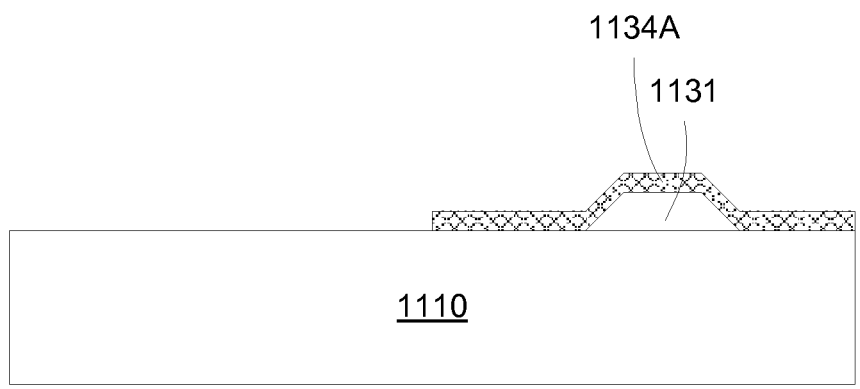
Figure 11C:
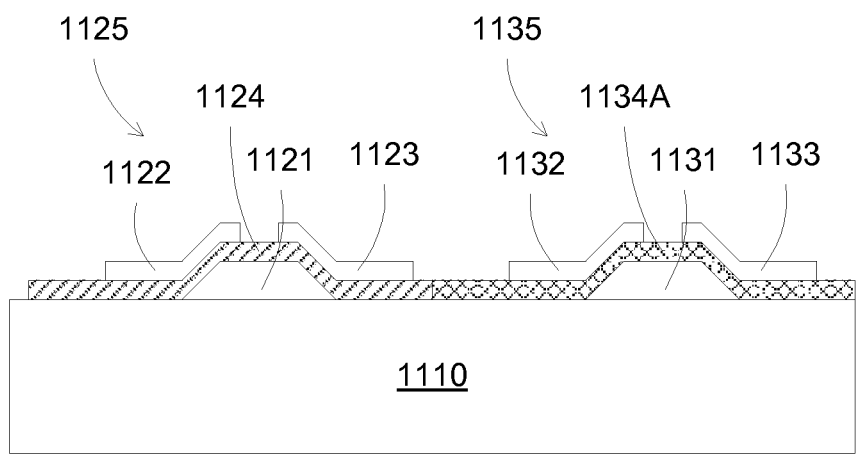

FIGS. 11A-11C illustrate a process of forming two different transistors on a substrate according to some embodiments. In FIG. 11A, an amorphous silicon layer 1134 can be deposited on a gate 1131. In FIG. 11B, the amorphous silicon layer 1134 is laser annealed to form polycrystalline silicon layer 1134A. In FIG. 11C, polycrystalline silicon transistor 1135 is formed using the polycrystalline layer 1134A, together with source and drain layers 1132 and 1133. Amorphous silicon transistor 1125 can be formed on the substrate 1110 (also on an optional oxide layer). The transistor 1125 includes a gate 1121, an amorphous (or polycrystalline) silicon layer 1124, and source and drain layers 1122 and 1123. The amorphous silicon layer can be between 10 and 50 nm thick. Interconnects can be added to form circuits to operate display pixels.

Figure 12A:
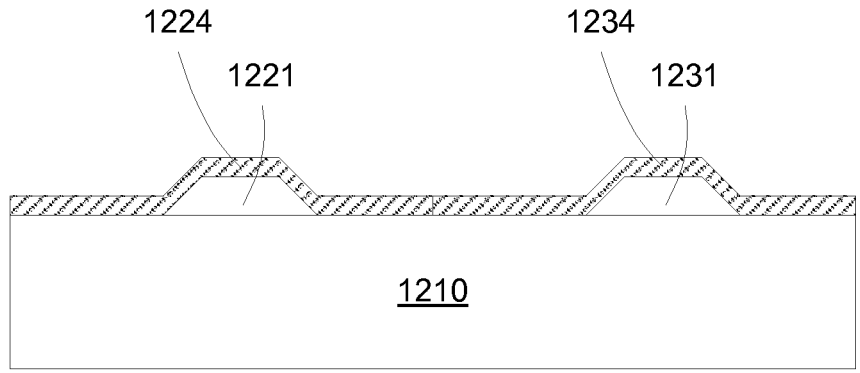
FIGS. 12A-12C illustrate a process of forming two different transistors on a substrate according to some embodiments.
Figure 12B:
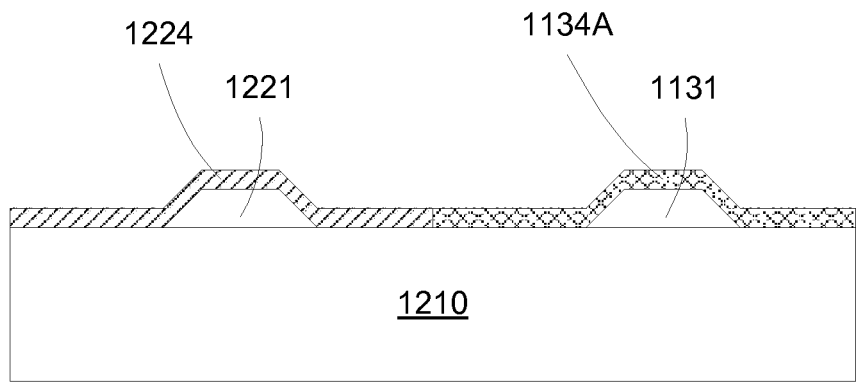
Figure 12C:
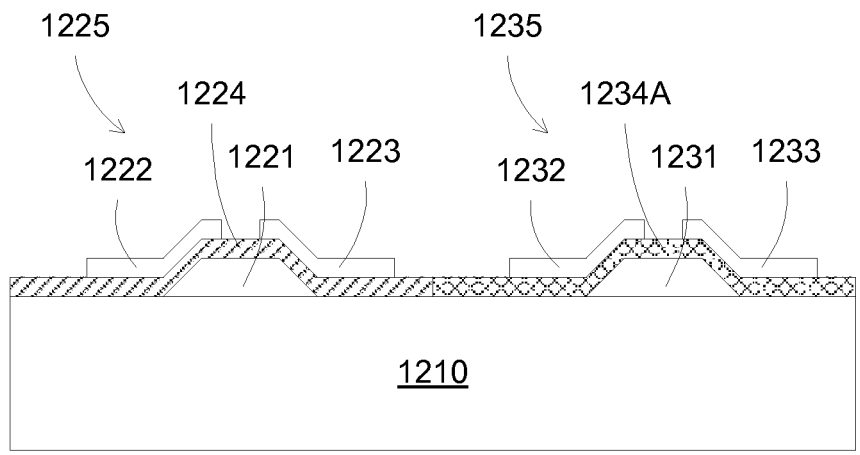

FIGS. 12A-12C illustrate a process of forming two different transistors on a substrate according to some embodiments. In FIG. 12A, amorphous silicon layers 1224 and 1234 can be deposited on a gates 1221 and 1231, respectively. In FIG. 12B, the amorphous silicon layer 1234 is laser annealed to form polycrystalline silicon layer 1234A. In FIG. 12C, polycrystalline silicon transistor 1235 is formed using the polycrystalline layer 1234A, together with source and drain layers 1232 and 1233. Amorphous silicon transistor 1225 can be formed on the substrate 1210 using the amorphous layer 1224, together with source and drain layers 1222 and 1223. The amorphous silicon layer can be between 10 and 50 nm thick. Interconnects can be added to form circuits to operate display pixels.

Figure 13:
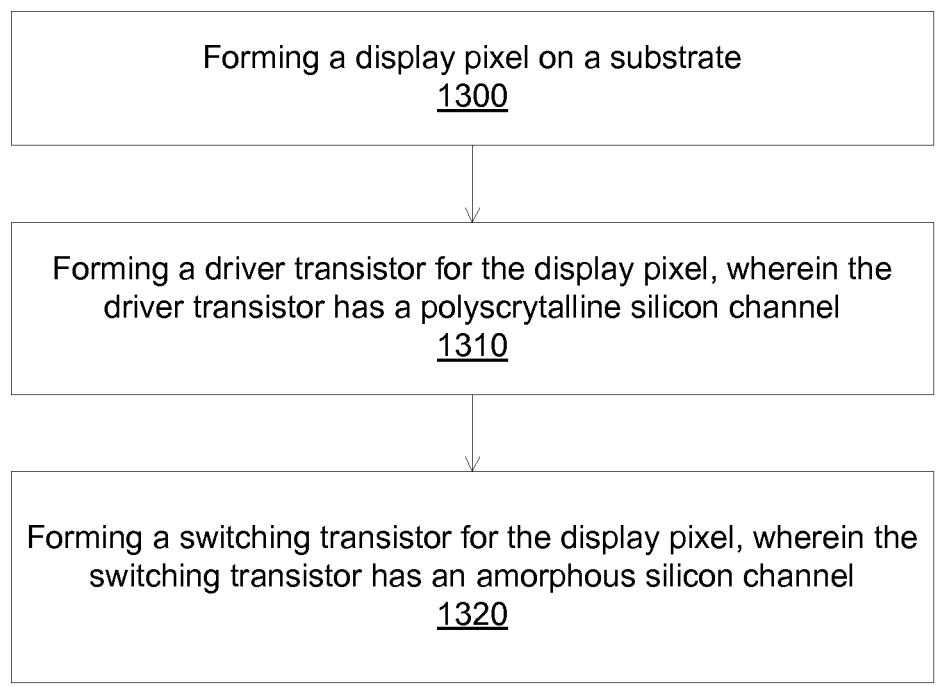
FIG. 13 illustrates a flow chart for forming a display according to some embodiments.

FIG. 13 illustrates a flow chart for forming a display according to some embodiments. Operation 1300 forms a display pixel on a substrate. Operation 1310 forms a driver transistor for the display pixel. The driver transistor has a polycrystalline silicon channel, for example, by laser annealing an amorphous silicon layer. Operation 1320 forms a switching transistor for the display pixel, such as for switching the driver transistor which can supply current to the pixel. The switching transistor has an amorphous silicon channel, for example, by depositing an amorphous silicon layer. Other sequences can be used, such as the pixels can be formed after the transistors, or the amorphous silicon transistor before the polycrystalline silicon transistor.

In some embodiments, the present invention discloses methods, and devices fabricated from the methods, to produce single crystal silicon layers on different substrates, such as glass substrates or polymer substrates. An epitaxial silicon layer can be deposited on a silicon substrate having surface pores. The surface pores can include smaller pores at the surface of the silicon substrate and larger pores under the smaller pores. The two layers of surface pores can be produced by an anodic etching process, for example, using HF. After deposition, the epitaxial silicon layer can be exfoliated from the surface pores, resulting in a single crystal silicon layer. A handle substrate can be bonded to the epitaxial silicon layer before the exfoliation process, resulting in a single crystal silicon layer on a substrate that can be non-single crystal silicon.

In some embodiments, the epitaxial silicon layer on a handle substrate can be used as a back plane for display devices, such as OLED displays. Control transistors can be fabricated on the single crystal layer, together with OLED layer to form OLED display devices. The single crystal silicon control transistors can provide higher forward current, for example, due to the high mobility of the single crystal epitaxial silicon layer.

In some embodiments, the epitaxial silicon layer can be patterned to form a patterned single crystal silicon layer for battery electrodes. The epitaxial silicon layer can be patterned in a high surface area configuration, such as a serpentine pattern, a holed plate pattern, or a column pattern. The high surface area of the silicon electrodes can provide better battery characteristics and performance, such as higher battery capacity.

In some embodiments, the present invention discloses methods for forming single crystal silicon layer, either alone or bonded to a substrate. The single crystal silicon layer can be epitaxially deposited on a single silicon substrate, with a porous interface to allow the exfoliation of the epitaxial layer from the substrate.

The epitaxial silicon layer can be deposited from silicon precursors such as silane, or tri-methyl silane, on a single crystal silicon template to preserve the crystallinity. The template used for the single crystal silicon wafers can be two level porous silicon structures formed on a single crystal silicon wafer by anodic etching in hydrofluoric acid. The top level of this structure is designed to have low porosity, from 15-40%, while the bottom layer will have 50% or more porosity, with each layer about 1 micron in thickness. The top layer porous silicon can be regarded as closely spaced columns of single crystal silicon about 1 micron in height, on top of each column of which single crystal silicon will nucleate and grow isotropically until all these coalesce into one single crystal wafer. After this lateral coalescence, the single crystal silicon wafer can be grown to the desired thickness.

One important feature of this process is that the surviving lower level porous silicon structure will evolve into large void structure that enables the easy detachment of the grown epitaxial wafer. This enabled fabrication of wafers with any thickness, such as 20 um, for use in solar cells with enormous reduction in silicon used for solar cells. The other advantage of this method, also termed as direct-gas-to-wafer method, is it bypasses expensive processes of polysilicon forming and refining, ingot crystal growth, wafer sawing, and surface preparation operations, and 'kerfs' losses; associated with these.

Figure 14A:
FIGS. 14A-14D illustrate a schematic process of forming a single crystal silicon layer according to some embodiments.
Figure 14B:
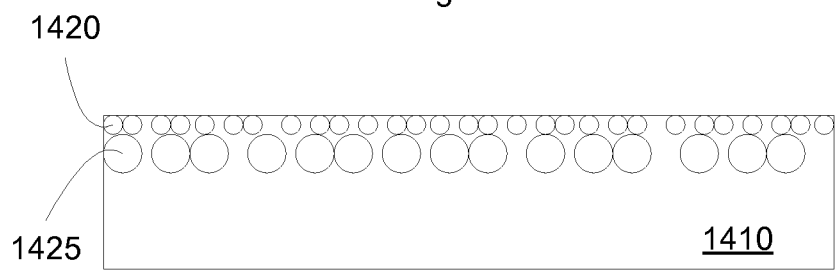
Figure 14C:
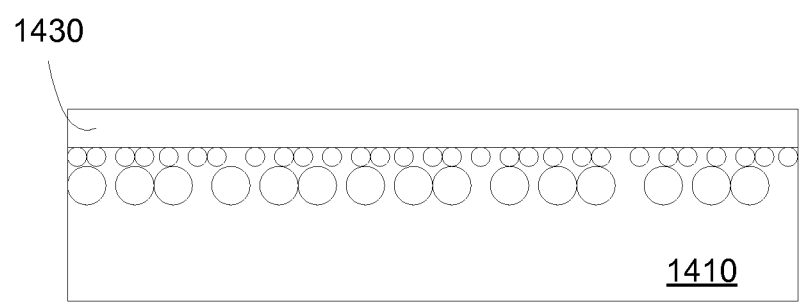
Figure 14D:
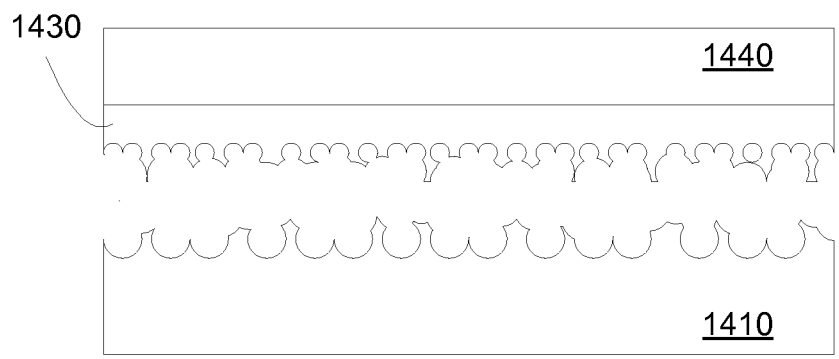

FIGS. 14A-14D illustrate a schematic process of forming a single crystal silicon layer according to some embodiments. In FIG. 14A, a single crystal silicon wafer 1410 can be provided. In FIG. 14B, two levels of pores 1420 and 1425 are formed on the silicon wafer 1410. The smaller pores 1420 are disposed near the surface, for example, to present a single crystal interface to act as a template for epitaxial deposition. The larger pores 1425 are disposed under the smaller pores, farther from the surface, for example, to simplify the exfoliation of the deposited epitaxial layer from the wafer 1410. In FIG. 14C, a silicon layer 1430 is deposited on the wafer 1410, on top of the pores 1420 and 1425. The deposition conditions of the silicon layer are selected to form epitaxial silicon layer, which can be facilitate by the presence of the single crystal silicon template surface of the silicon wafer 1410. In FIG. 14D, the composite substrate, e.g., the epitaxial layer 1430 on the silicon wafer 1410 through the porous interface, can be subjected to a high temperature process, which can coalesce the pores and exfoliate the epitaxial layer 1430 from the wafer 1410. The exfoliated surface can be rough, or can be smooth, depending on the process condition. An optional cleaning process, such as an HF etch, can clean and smooth the exfoliated surface. Optional handle substrate 1440 can be bonded to the epitaxial layer 1430 to provide support. For example, if the epitaxial layer is thin, such as less than 20 microns, then a handle substrate, such as a glass substrate or a polymer substrate, can provide support to allow the epitaxial layer 1430 to be exfoliated in one piece. If the epitaxial layer is thick, e.g., greater than about 20 microns or greater than about 50 microns, then the layer can be a standalone layer without support layer.

Figure 15A:
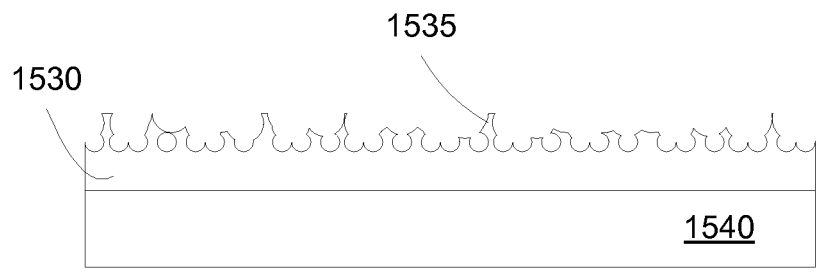
FIGS. 15A-15C illustrate a schematic surface cleaning for an exfoliated layer according to some embodiments.
Figure 15B:
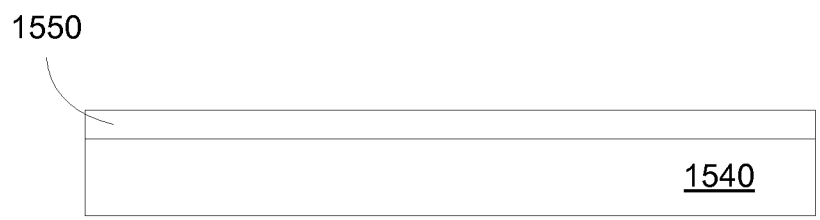
Figure 15C:

FIGS. 15A-15C illustrate a schematic surface cleaning for an exfoliated layer according to some embodiments. In FIG. 15A, the exfoliated layer can include an epitaxial silicon layer 1530 on a support substrate 1540. Alternatively, the exfoliated layer can consist only of the epitaxial silicon layer 1530, e.g., without the support substrate 1540. Further, other layers can be disposed between the epitaxial layer 1530 and the substrate 1540. The epitaxial layer 1530 can have a rough surface 1535, for example, due to the breaking from the pores at the interface with the silicon wafer.

The epitaxial layer 1530 can have any thickness, such as greater than a few microns, to thousand of microns. In general, the first micron in thickness can have some defects, due to the proximity with the pore interface. Therefore, an epitaxial layer of greater than about 3 microns can be provided.

In FIG. 15B, the epitaxial layer 1530 can be cleaned and/or etched to provide a clean and smooth surface 1550. The epitaxial layer can be oxidized, and then etched in HF to remove the oxide layer. Alternatively, an etch solution including HF and an oxidant, such as ethanol, can be used to oxidize and etch the epitaxial layer. Further, during the high temperature exfoliation, a portion of the epitaxial layer surface can be oxidized, thus an HF clean can remove the roughness of the exfoliated layer.

In FIG. 15C, the smooth epitaxial layer 1550 can be thinned to form layer 1555, for example, at a few microns to remove the defected surface near the pore interface. Further, the epitaxial layer can be thinned to any desired thickness, depending on the applications. The thinning process can be performed in a solution of HF/oxidant, such as HF and ethanol.

Despite the enormous advantages of this scheme for making epitaxial wafers, which is easily apparent from the above description, its actual realization also needed the development of tools for large-scale epitaxial silicon growth. Here again the price competition for low cost, high efficiency solar cells drove some companies to develop large in-line epitaxial reactors, which could deposit epitaxial silicon simultaneously, and at rapid rates on a large number of wafers. It is the development of such equipment and the low cost of ownership for epitaxial wafers that made this process possible.

In some embodiments, the present invention discloses methods, and products fabricated from the methods, to form displays using the exfoliated silicon layer. For example, the back plane for OLED and AMOLED and related displays can be fabricated using the exfoliated epitaxial silicon layer bonded to a support substrate. In particular, provided is the semiconductor material layer in which the TFTs are fabricated and the method for forming the same uniformly, in large volumes, and economically.

Active-matrix Organic Light Emitting Diodes (AMOLED) display consists an active matrix of OLED pixels deposited on to an array of thin film transistors (TFT) and that become luminescent upon electrical activation of the TFT switches to control the current flowing into each pixel. The TFT backplane technology is crucial to the fabrication of AMOLED technologies. The two primary TFT backplane technologies are (a) amorphous silicon and (b) low temperature multi-crystalline silicon, which is obtained from laser-induced crystallization of amorphous silicon.

The back planes for these displays are formed on large glass sheets, or on high temperature polymeric sheets, such as polyimide films. Glass sheets have the advantage in being made in large volumes for today's large televisions, are transparent, and permit coating and device fabrication at temperatures in excess of 500° C. The leading semiconductor material, for the TFT back plane is amorphous silicon, a-Si, which can be formed on the glass sheets from decomposition of silicon-compound containing gas at relatively low temperatures. Amorphous silicon backplanes restricts the resolution attainable in the display because of its very low electron mobility of 1 $cm^2$/volt-s.

Severe limitation of the amorphous silicon back plane, led to the development of low temperature polycrystalline silicon back plane, which is a laser-annealed product of amorphous silicon. This kind of backplane is now indispensable for OLED and AMOLED displays, since it improves the resistance characteristic over amorphous silicon by a factor of 50 cm2/Volt-S.

As good as this improvement that it is, there is need for even greater improvement in this characteristic without increasing cost too much. Single-crystalline silicon backplanes would be a logical evolution from amorphous silicon, a-Si, to low temperature polycrystalline silicon, LTPS. Standard single crystal silicon wafers would have excellent material characteristics for backplane applications, but fall short from the point of a. form factor, because they are too thick for thin displays, and b. they will be too expensive to use for this application.

The so-called SIOG, or (Single Crystal) Silicon on Glass technology jointly developed by Corning and SOITEC, was aimed at precisely solving these problems for using single-crystal silicon for OLED backplanes in AMOLED displays for small mobile devices. A very thin (<1 um) of single crystal silicon layer defined by hydrogen-ion implant into the wafer surface, is transferred onto a suitable glass plate by low-temperature bonding method developed by SOITEC. The Corning's silicon-on-glass technology is a thin, single-crystal silicon film applied to Corning display glass. This development was expected to produce an engineered substrate with outstanding electrical mobility and material uniformity, upon which electronic circuits can be easily applied by display manufacturers. The promise of single crystal silicon backplanes with very thin form factor and low cost has still not materialized. The reasons for this may be both cost, manufacturability and insufficient gain in electron mobility because of the extremely thin, less than 1 micron of silicon thickness transferred by this method. Thicker layers, a thick as 20 um, possible by this so-called hydrogen-ion implant exfoliation have been shown to be possible but have unknown technical, safety, and cost barriers to make it into commercial production, despite many years of development. Several of these companies have essentially given up in just the past year.

In some embodiments, the present invention discloses backplanes for OLED and AMOLED displays having thicker, 3 um to 50 um, epitaxially grown, single crystal silicon bonded to a suitable substrate. The substrate could be suitable glass, or a polymeric film. The glass substrate, such as those provided by Corning or other companies for large display applications, and which are quite refractory and thermal expansion close to but slightly higher than that of silicon. The thermal expansion range for the glass for should range from 3.0 to 5-0 μm/° C.

A thicker layer of single crystal silicon, 3 um-50 um, would have the best characteristics for backplane creation such as high electron mobility, and device processing ability with conventional methods, while also have the right form factor for thin displays.

Until recently, the use of thin epitaxially grown silicon for the backplane application could not have been envisaged. The cost of single wafer epitaxy tools common in semiconductor industry would have been prohibitive, and the cost of equipment needed for producing a large numbers of wafers needed for such a high volume application would simply not imaginable. But thanks to resurgence of solar industry, several companies have designed and built in-line, industrial epitaxy reactors capable holding large pallets of wafers. Epitaxial silicon is formed by thermal decomposition of gaseous silicon species such as tri-methyl silane. The cost of the separable silicon layer is low enough to compete against conventional silicon solar-grade wafers.

The epitaxial layer is deposited the on a very thin porous silicon formed by anodic-etching into the wafer surface. This porous layer forms the separation layer for epitaxial silicon, enabling one to grow and separate layers as thin as 3 um, and thicker if necessary.

The cost for the epitaxial silicon layer for this application will be even lower because the thickness needed could be as low as 5 um, whereas solar cells need 50 um or thicker. This is very important because, in the face of rapidly falling prices for solar wafers, this application would be welcomed by companies already set up to produce solar cells.

In some embodiments, the grown epitaxial layer is directly exfoliated from the porous silicon layer on to the glass or high temperature polymer such as polyimide substrate of the back plane. To accomplish this, the glass plate is thermally-bonded to the epitaxial layer at temperatures' to ranging from 400° C.-900 C on glass. For polymer film exfoliation, the upper limit for bonding and exfoliation is 400° C. After the exfoliation the thicker mother silicon wafer can be reused to generate as many as 25 more epitaxial layers, further lowering the overall cost for the backplanes.

Figure 16:
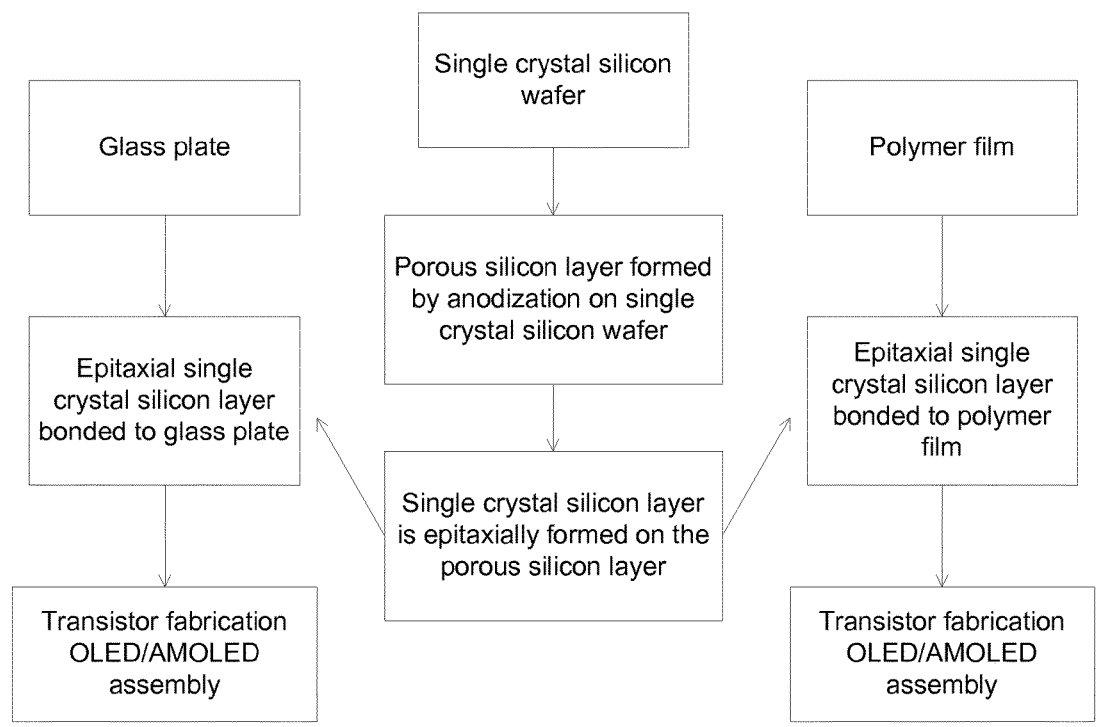
FIG. 16 illustrates a schematic of a process sequence for the backplanes according to some embodiments.

FIG. 16 illustrates a schematic of a process sequence for the backplanes according to some embodiments. A single crystal silicon wafer can be provided. Porous silicon layer can be formed on the single crystal silicon wafer by anodization. Epitaxial silicon layer can be deposited on the porous silicon layer.

The epitaxial silicon layer can be bonded to a glass plate or a polymer film. The epitaxial layer can be exfoliated to form a composite substrate, including a single crystal silicon layer on a substrate, such as a glass plate or a polymer film. The back plane process can be formed on the composite substrate, followed by forming OLED or AMOLED display. The materials and methods for producing the OLED and AMOLED displays on such backplanes are well known in the industry, and thus not provided here.

Figure 17A:
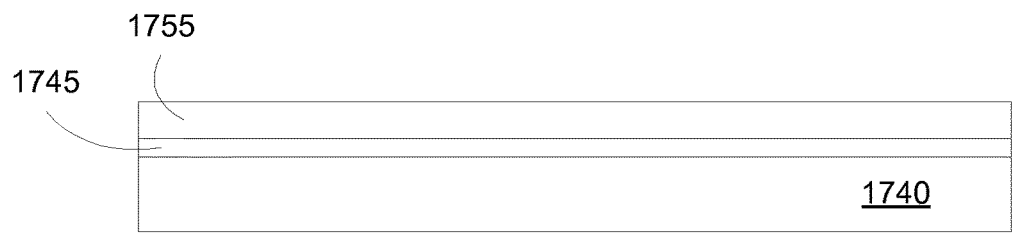
FIGS. 17A-17C illustrate a schematic process for forming a display according to some embodiments.
Figure 17B:
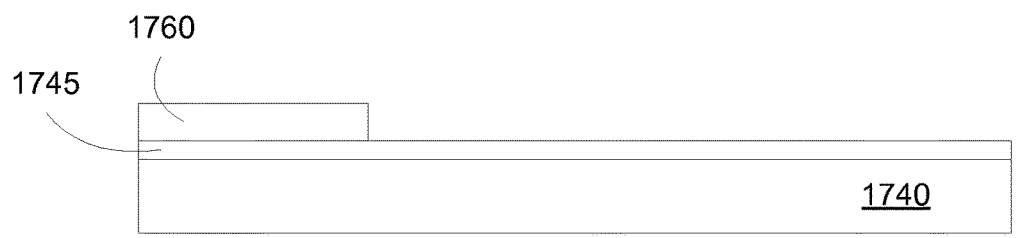
Figure 17C:
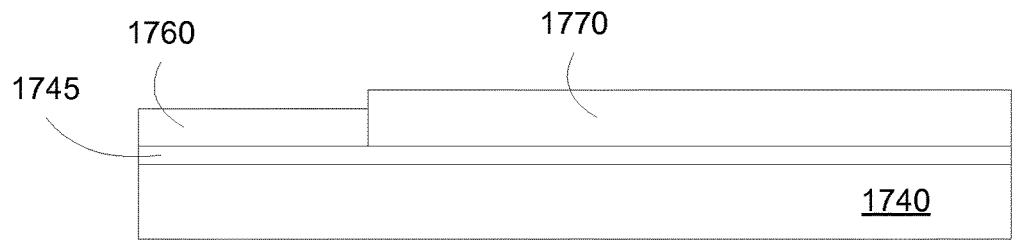

FIGS. 17A-17C illustrate a schematic process for forming a display according to some embodiments. In FIG. 17A, a glass substrate 1740 can include a transparent conductive layer such as an indium tin oxide (ITO) layer 1745, before being bonded to the epitaxial silicon layer 1755 from the porous silicon wafer. Thus the composite substrate can include an epitaxial layer 1755 on an ITO layer 1745 on a glass substrate 1740. The epitaxial layer 1755 can be cleaned and thinned to a desired thickness.

In FIG. 17B, the epitaxial layer 1755 can be patterned to become the transistor layer 1760, which includes control transistor devices for controlling OLED pixel. A portion of the epitaxial layer 1755 can be removed, for example, by a wet etch, to expose the ITO under layer.

In FIG. 17C, OLED device 1770 can be formed on the exposed ITO portion. The transistor devices in the transistor layer 1760 can be coupled to the OLED device 1770 to control the current through the OLED device.

Figure 18A:
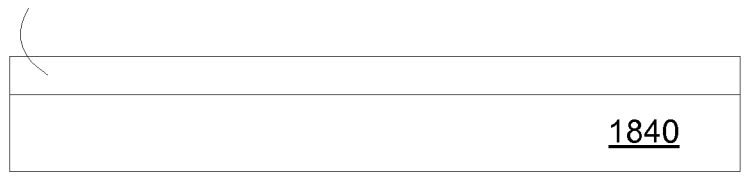
FIGS. 18A-18C illustrate another schematic process for forming a display according to some embodiments.
Figure 18B:
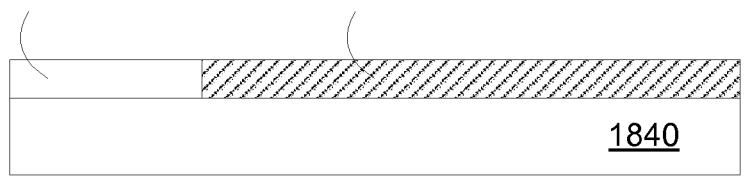
Figure 18C:
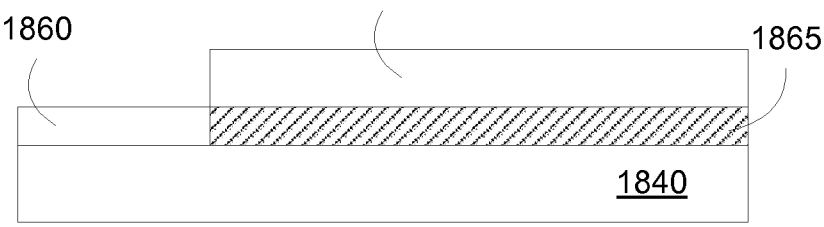

FIGS. 18A-18C illustrate another schematic process for forming a display according to some embodiments. In FIG. 18A, a glass substrate 1840 can be bonded to the epitaxial silicon layer 1855 from the porous silicon wafer. Thus the composite substrate can include an epitaxial layer 1855 on a glass substrate 1840. The epitaxial layer 1855 can be cleaned and thinned to a desired thickness.

In FIG. 18B, the epitaxial layer 1855 can be patterned to become the transistor layer 1860, which includes control transistor devices for controlling OLED pixel. A portion 1865 of the epitaxial layer 1855 can be doped, for example, to a heavy dose to become n+, to form a conductive under layer for the OLED device.

In FIG. 18C, OLED device 1870 can be formed on the doped epitaxial layer 1865. The transistor devices in the transistor layer 1860 can be coupled to the OLED device 1870 to control the current through the OLED device.

The epitaxial layer can be optimized for the control transistor performance, such as increasing forward current and reducing leakage current. For example, the epitaxial layer can be thinned to an optimal thickness to reduce leakage current. Well doping can also be used.

Figure 19A:
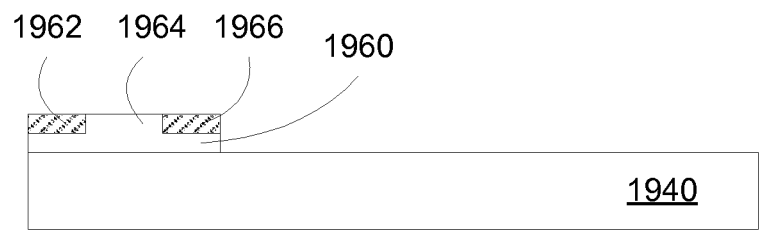
FIGS. 19A-19C illustrate different schematic transistor fabrications for the epitaxial layer according to some embodiments.
Figure 19B:
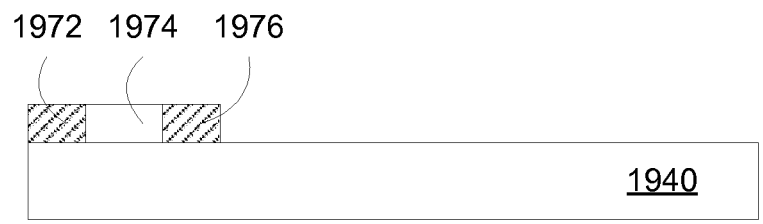
Figure 19C:
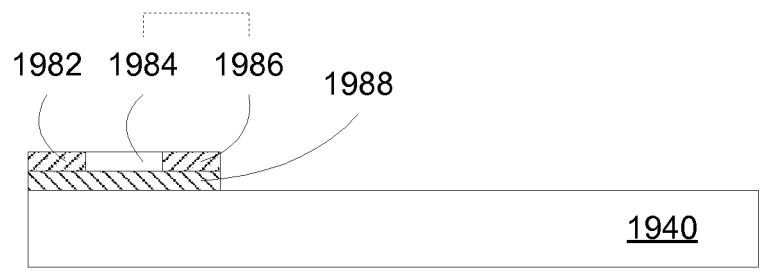

FIGS. 19A-19C illustrate different schematic transistor fabrications for the epitaxial layer according to some embodiments. In FIG. 19A, the epitaxial layer can be doped to form source and drain regions 1962 and 1966, together with forming transistor channel 1964 between the source and drain regions on substrate 1940. The source and drain can be shallow, leaving a portion 1960 of the epitaxial layer.

In FIG. 19B, the epitaxial can be thinned, or the source/drain doping can be performed to provide a direct channel 1974 between the source and drain regions 1972 and 1976. In FIG. 19C, a portion 1988 of the epitaxial layer can be counter doped, leaving a direct channel 1984 between the source and drain regions 1982 and 1986.

In some embodiments, the epitaxial layer can be patterned, so that a patterned single crystal silicon layer can be bonded to the support substrate. The patterned epitaxial layer can facilitate the fabrication process of the subsequent control transistor devices.

Figure 20A:
FIGS. 20A-20H illustrate a schematic process for patterning an epitaxial layer according to some embodiments.
Figure 20B:
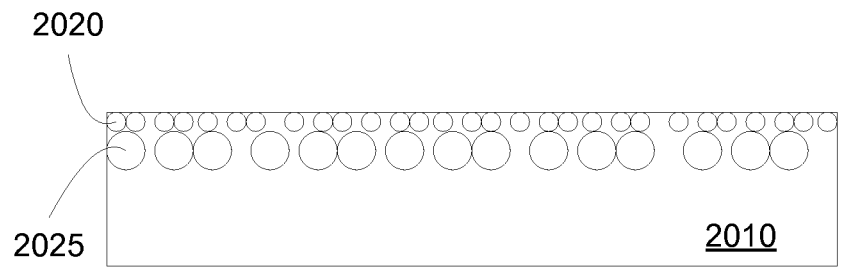
Figure 20C:
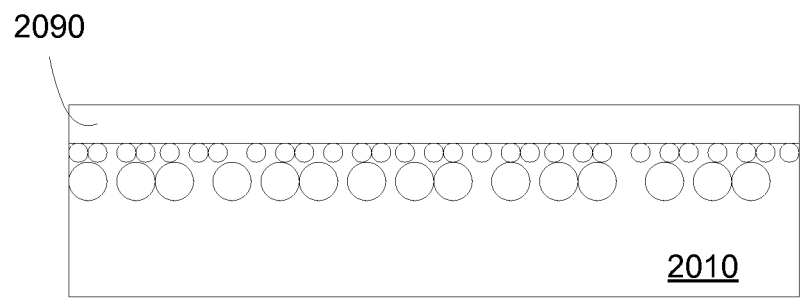
Figure 20D:
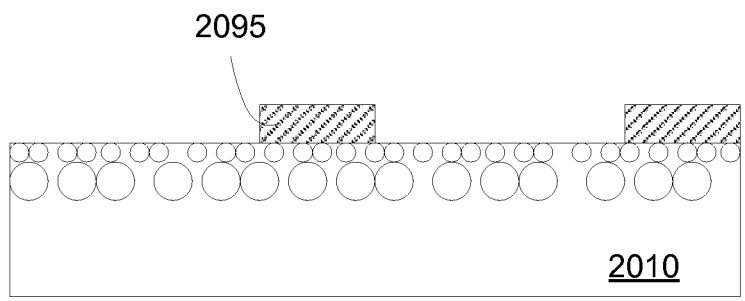
Figure 20E:
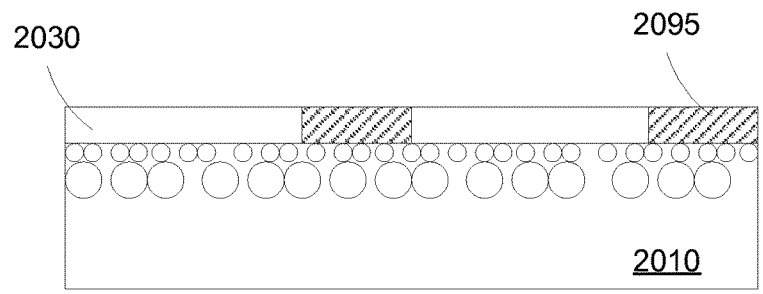

FIGS. 20A-20H illustrate a schematic process for patterning an epitaxial layer according to some embodiments. In FIG. 20A, a single crystal silicon wafer 2010 can be provided. In FIG. 20B, two levels of pores 2020 and 2025 are formed on the silicon wafer 2010. The smaller pores 2020 are disposed near the surface, for example, to present a single crystal interface to act as a template for epitaxial deposition. The larger pores 2025 are disposed under the smaller pores, farther from the surface, for example, to simplify the exfoliation of the deposited epitaxial layer from the wafer 2010. In FIG. 20C, a sacrificial layer, such as a carbon-containing layer such as a photoresist layer 2090, can be formed on the wafer 2010, on top of the pores 2020 and 2025. In FIG. 20D, the photoresist layer 2090 can be patterned, for example, by a photolithography process, to form pattern layer 2095. In FIG. 20E, a silicon layer 2030 is deposited on the wafer 2010, on top of the pores 2020 and 2025. The deposition conditions of the silicon layer are selected to form epitaxial silicon layer, which can be facilitate by the presence of the single crystal silicon template surface of the silicon wafer 2010. The deposition conditions can be selected to provide a selective deposition process, depositing silicon only on the exposed portion of the wafer 2010, and without deposition on the pattern layer 2095. The deposition conditions can include a silane deposition at a temperature above 500-600 C. During the ramp up of temperature, the patterned photoresist 2095 can be burned off, leaving carbon patterned layer.

Figure 20F:
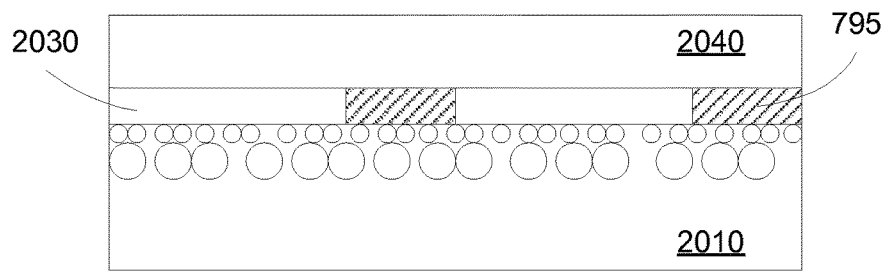
Figure 20G:
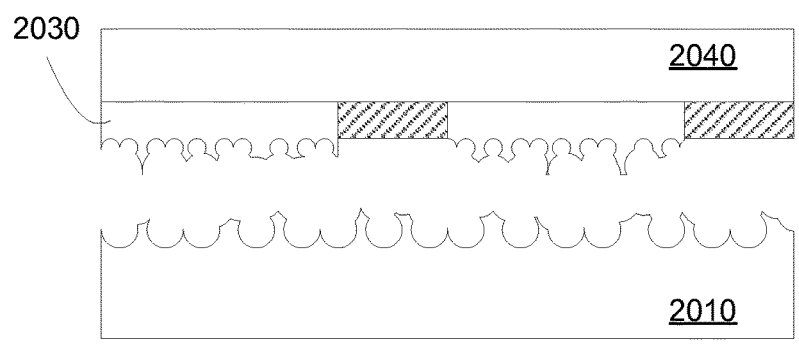
Figure 20H:
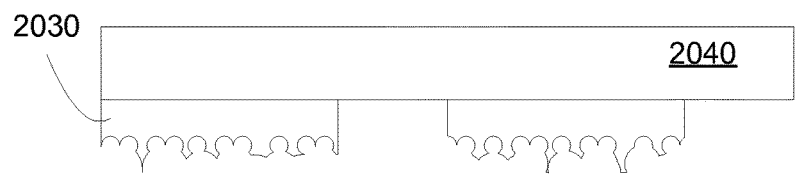

In FIG. 20F, a support substrate 2040 can be bonded to the epitaxial layer 2030 and the patterned layer 2095. In FIG. 20G, the composite substrate, e.g., the epitaxial layer 2030 on the silicon wafer 2010 through the porous interface, can be subjected to a high temperature process, which can coalesce the pores and exfoliate the epitaxial layer 2030 from the wafer 2010. The exfoliated surface can be rough, or can be smooth, depending on the process condition. An optional cleaning process, such as an HF etch, can clean and smooth the exfoliated surface. In FIG. 20H, the patterned layer 2095 can be removed, leaving the patterned epitaxial layer 2030 on the support substrate 2040.

Figure 21A:
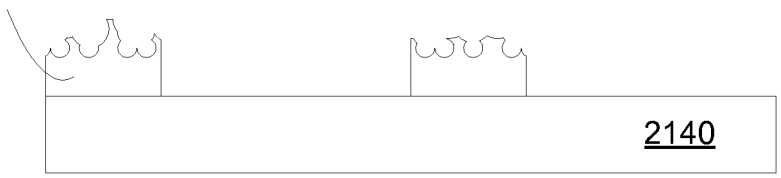
FIGS. 21A-21C illustrate a schematic display fabrication process according to some embodiments.
Figure 21B:
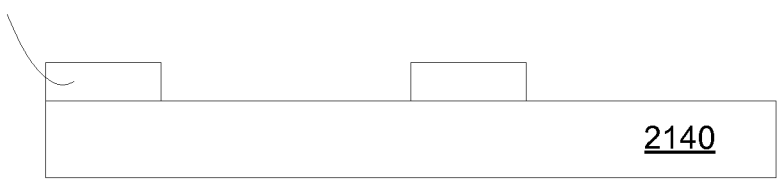
Figure 21C:
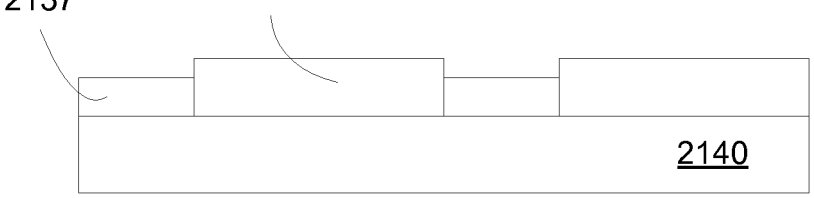

FIGS. 21A-21C illustrate a schematic display fabrication process according to some embodiments. In FIG. 21A, the exfoliated layer can include a patterned epitaxial silicon layer 2135 on a support substrate 2140. Other layers can be disposed between the epitaxial layer 2135 and the substrate 2140, such as a conductive oxide layer such as ITO. The patterned epitaxial layer 2135 can have a rough surface, for example, due to the breaking from the pores at the interface with the silicon wafer.

In FIG. 21B, the patterned epitaxial layer 2135 can be cleaned and/or etched to provide a patterned epitaxial layer 2137 having a clean and smooth surface. The patterned epitaxial layer 2135 or 2137 can be optionally thinned, for example, at a few microns to remove the defected surface near the pore interface. Further, the epitaxial layer can be thinned to any desired thickness, depending on the applications. Control transistor devices can be fabricated on the patterned epitaxial layer 2137.

In FIG. 21C, OLED device 2170 can be formed between the patterned epitaxial layer 2137. An ITO layer can be present on the substrate 2140, and thus the OLED device 2170 can be formed on the ITO portion. The transistor devices in the epitaxial layer 2137 can be coupled to the OLED device 2170 to control the current through the OLED device.

In some embodiments, the present invention discloses methods, and back planes and displays fabricated from the methods, to form back planes and displays, such as OLED or AMOLED displays. The key features can include a backplane including single crystal silicon of thickness 3 um or thicker on a support substrate. The above single crystal silicon layer can be formed by epitaxially growing to the desired thickness on a porous silicon layer on single crystal silicon wafer formed by anodizing and subsequently exfoliating it and transferring it to a support substrate. The support substrate can be a glass substrate having a CTE of between $3\text{-}5\times 10^{-7}/^\circ$ C. The transfer of the epitaxially grown silicon layer can be performed by bonding the glass substrate to it. The bonding can be performed by heating the glass to temperature to soften and attach itself to the epitaxial single crystal silicon to exfoliate it from the porous silicon layer. The exfoliation can occur spontaneously upon cooling from the bonding temperature (e.g., due to differential contraction).

In some embodiments, the support substrate can be a polymer film. The polymer film can be a thermoplastic polymer. The polymer film can be polyimide. The polymer film can be is bonded to the epitaxial silicon layer by applying heat and pressure. The polyimide film can be bonded to the epitaxial silicon layer with a polyimide adhesive. The exfoliation of the epitaxial single crystal silicon layer can be carried out by peeling it from the porous silicon layer. The backplane for OLED and AMOLED displays can include thin film transistors formed in the 3 um or thicker single crystal silicon layer on the support film. The completed product, e.g., the OLED or AMOLED display, can include a backplane with polymeric light emitting active component sandwiched between it and a transparent electrode face.

Figure 22A:
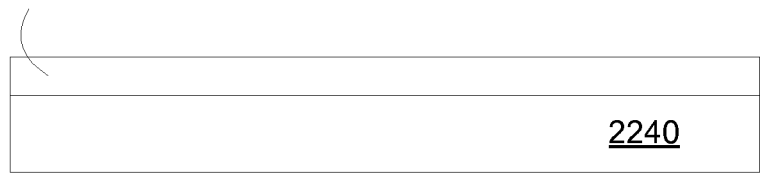
FIGS. 22A-22C illustrate a process for fabricating devices according to some embodiments.
Figure 22B:
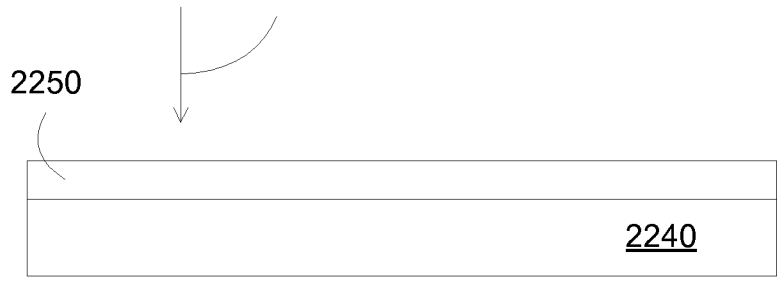
Figure 22C:
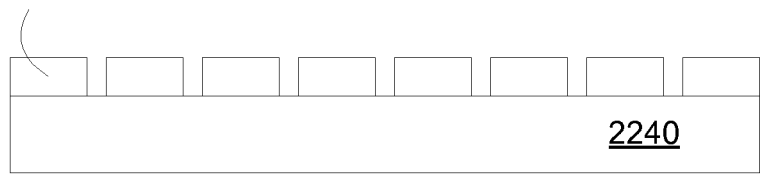

FIGS. 22A-22C illustrate a process for fabricating devices according to some embodiments. In FIG. 22A, an exfoliated epitaxial silicon layer 2250 is bonded to a substrate, such as a glass substrate 2240. Transistor devices can be fabricated on the epitaxial layer 2250. Since the epitaxial layer is single crystal silicon, high performance transistor devices, e.g., performance comparable with transistor devices fabricated on single crystal silicon wafers, can be achieved. In FIG. 22B, a laser beam 2270 can be applied on the silicon layer 2250, for example, to singulate the layer into separate devices. FIG. 22C shows multiple device portions 2255, which have been singulated by the laser beam. Alternatively, reactive ion etching can be used to separate the devices. The epitaxial layer can be bonded to the substrate through a sacrificial layer, which can be removed after the device singulating process to achieve individual devices.

Figure 23A:
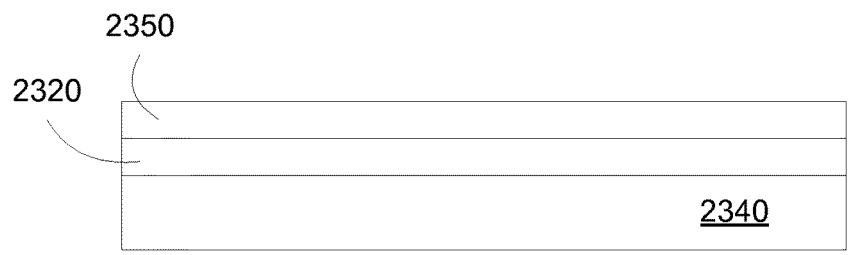
FIGS. 23A-23D illustrate another process for fabricating devices according to some embodiments.
Figure 23B:
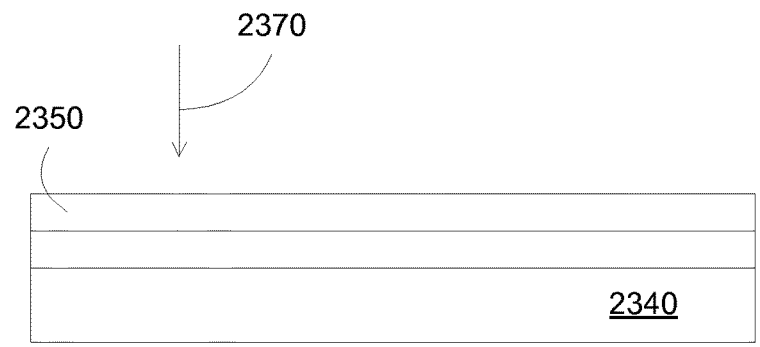
Figure 23C:
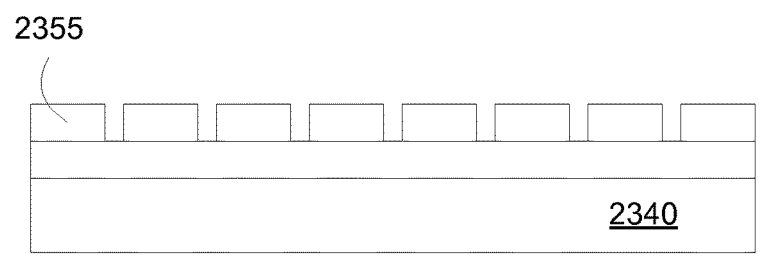
Figure 23D:
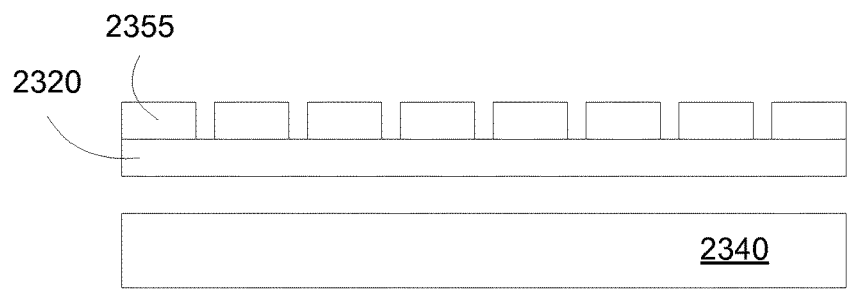
Figure 23D:
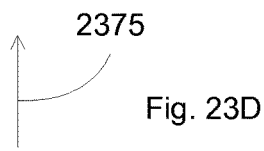

FIGS. 23A-23D illustrate another process for fabricating devices according to some embodiments. In FIG. 23A, an exfoliated epitaxial silicon layer 2350 is bonded to a polymer layer 2320 on a substrate, such as a glass substrate 2340. Transistor devices can be fabricated on the epitaxial layer 2350. Since the epitaxial layer is single crystal silicon, high performance transistor devices, e.g., performance comparable with transistor devices fabricated on single crystal silicon wafers, can be achieved. In FIG. 23B, a laser beam 2370 can be applied on the silicon layer 2350, for example, to singulate the layer into separate devices. FIG. 23C shows multiple device portions 2355, which have been singulated by the laser beam. Alternatively, reactive ion etching can be used to separate the devices. In FIG. 23D, a laser beam 2375 can be applied through the glass substrate 2340 to separate the polymer layer 2320 from the glass substrate 2340.

In some embodiments, the present invention discloses methods to form patterned silicon film with high surface area. The patterned silicon film can be fabricated from epitaxial silicon layer, formed on a porous silicon wafer, and exfoliated from the porous silicon wafer.

In some embodiments, the present structures that are formed today by etching of silicon wafer through resist masks, a process we call as 'subtractive' process, can be replaced with advantage by epitaxial deposition, or an 'additive process'. Here, suitable masks are placed or formed on top the porous silicon layer during epitaxy. Single crystal silicon will grow up through the mask openings. The epitaxial silicon wafer will form in the shape of the negative image of the mask. Upon cooling from the growth temperature of about 1000 C, the mask can be removed mechanically or, in the case of a graphite mask, simply burnt off in air.

Many useful structures today are fabricated in single crystal silicon wafers by dry or wet etching into the wafers through resist masks. The examples of such useful structures are many such as inter-digitated electrode structures for capacitors to increase available electrode area per unit area, silicon electrodes for lithium battery, other MEMS devices, to name just a few.

Dry etching method such as Deep Reactive Ion Etching, DRIE, is used for etching through a silicon wafer to make a Super Capacitor Structure. The DRIE tools are available only in the context of semiconductor chip fabrication. Their cost of ownership for structural silicon products such as this tends to be too high. Similarly, it is also true for fabricating a structure of silicon pillars, which can be used as an electrode for lithium battery. In this application, the individual pillars of such a structure can freely expand upon absorbing lithium ions without breaking up. Other structures can be formed in single crystal silicon.

The high equipment costs, and low throughputs of such DRIE and wet etching processes is a great impediment to commercialization of products based on these structures. In some embodiments, the present invention provides a process scheme to enable easy, economical, and high throughput processes for fabricating such structures.

In some embodiments, a source silicon wafer can be first anodically etched by a two-step process to form a double layer porous silicon structure with a low porosity layer on top of a high porosity layer, by methods known in the industry. To form the inter-digitated silicon structure in epitaxial silicon, a contact mask made of graphite is placed or formed over the porous silicon on top of the source wafer. Epitaxial silicon layer allowed to grow through the mask openings to the desired thickness. After the silicon growth is completed, the reactor is cooled and the epitaxial layer along with graphite mask is separated from the source wafer and the graphite mask is removed physically. In some cases the graphite mask can be removed conveniently by burning off. This leaves behind the inter-digitated electrode structure for use for forming the electrodes for a supper capacitor, or for a battery.

In the above example, if the dimensions of the structure need to be accurate, or for forming more intricate structures in the epitaxially grown silicon, the mask could be formed in a photo resist, such as SU-8, which upon heating in the reducing ambient to the epitaxy growth temperature becomes carbonized. Epitaxial silicon film having circular perforations or columns can be provided.

Figure 24A:
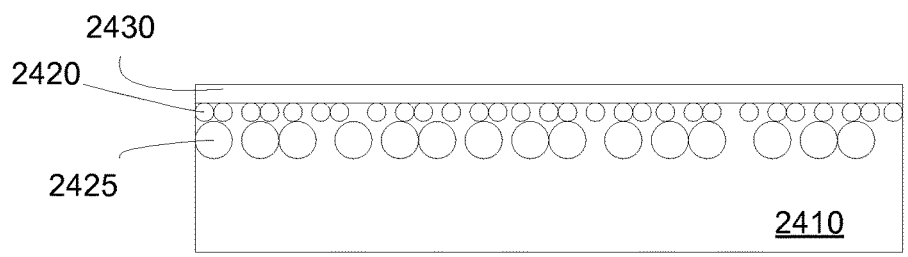
FIGS. 24A-24E illustrate a schematic process for patterning a silicon film according to some embodiments.

FIGS. 24A-24E illustrate a schematic process for patterning a silicon film according to some embodiments. In FIG. 24A, a single crystal silicon wafer 2410 can be provided. Two levels of pores 2420 and 2425 are formed on the silicon wafer 2410. An epitaxial silicon layer 2430 can be formed on the porous silicon wafer 2410.

Figure 24B:
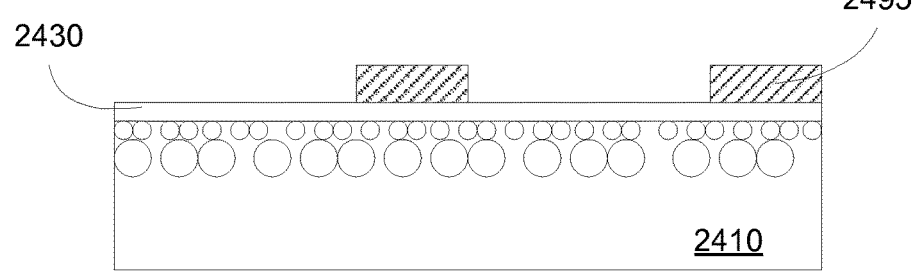

In FIG. 24B, a sacrificial layer, such as a carbon-containing layer such as a photoresist layer, can be formed on the wafer 2410, on top of the pores 2420 and 2425. The photoresist layer can be patterned, for example, by a photolithography process, to form pattern layer 2495.

Figure 24C:
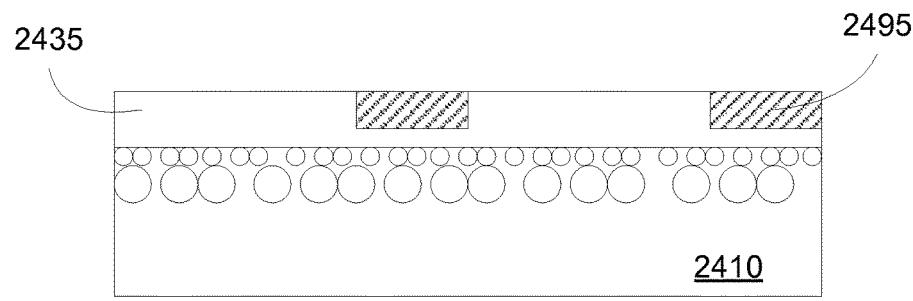

In FIG. 24C, an epitaxial silicon layer 2435 is deposited on the wafer 2410, on top of the existing epitaxial layer 2430. The deposition conditions of the silicon layer are selected to form epitaxial silicon layer, which can be facilitate by the presence of the single crystal silicon template surface of the epitaxial layer 2430. The deposition conditions can be selected to provide a selective deposition process, depositing silicon only on the exposed portion of the wafer 2410, and without deposition on the pattern layer 2495. The deposition conditions can include a silane deposition at a temperature above 500-900 C. During the ramp up of temperature, the patterned photoresist 2495 can be burned off, leaving carbon patterned layer.

Figure 24D:
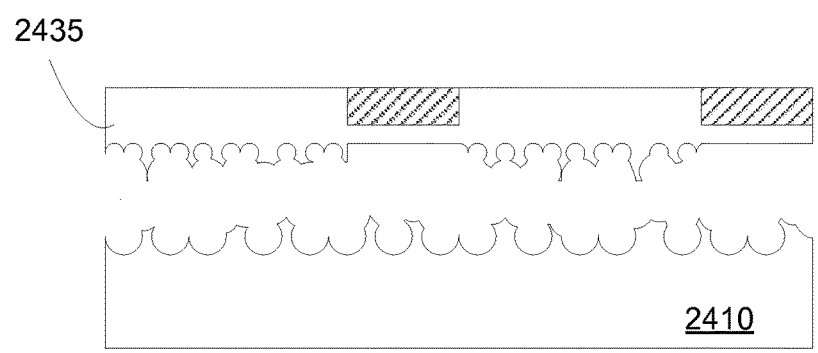

In FIG. 24D, the composite substrate, e.g., the epitaxial layer 2435 on the silicon wafer 2410 through the porous interface, can be subjected to a high temperature process, which can coalesce the pores and exfoliate the epitaxial layer 2435 from the wafer 2410. The exfoliated surface can be rough, or can be smooth, depending on the process condition. An optional cleaning process, such as an HF etch, can clean and smooth the exfoliated surface.

Figure 24E:
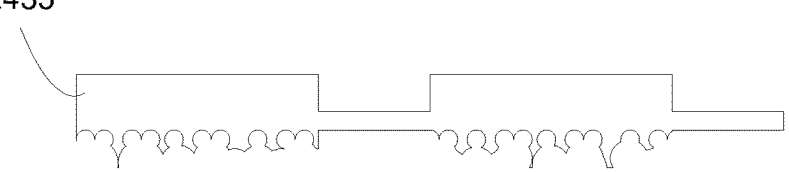

In FIG. 24E, the patterned layer 2495 can be removed, leaving a patterned epitaxial layer 2435. The epitaxial layer 2435 can be thick enough to be standing alone. The epitaxial layer 2435 can include the patterned of the carbon patterning layer 2495.

Figure 25A:
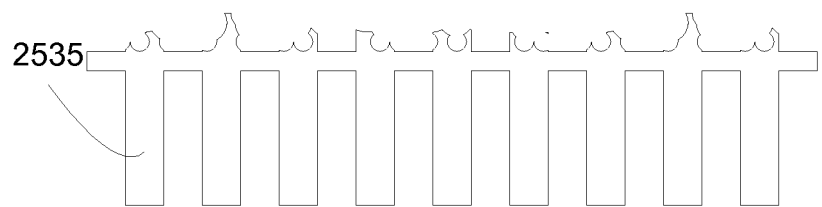
FIGS. 25A-25C illustrate a patterned silicon film having pillars according to some embodiments.
Figure 25B:
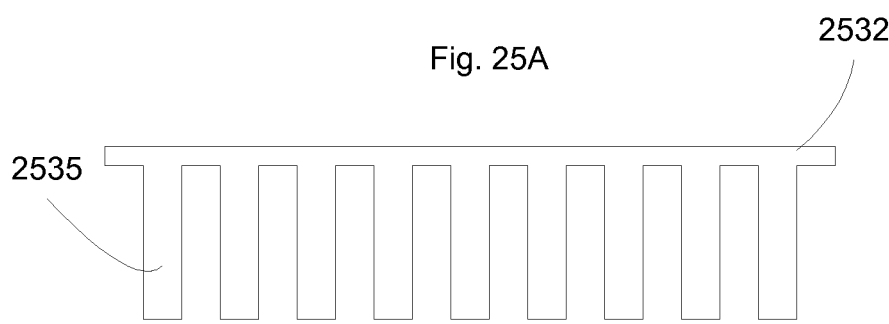
Figure 25C:
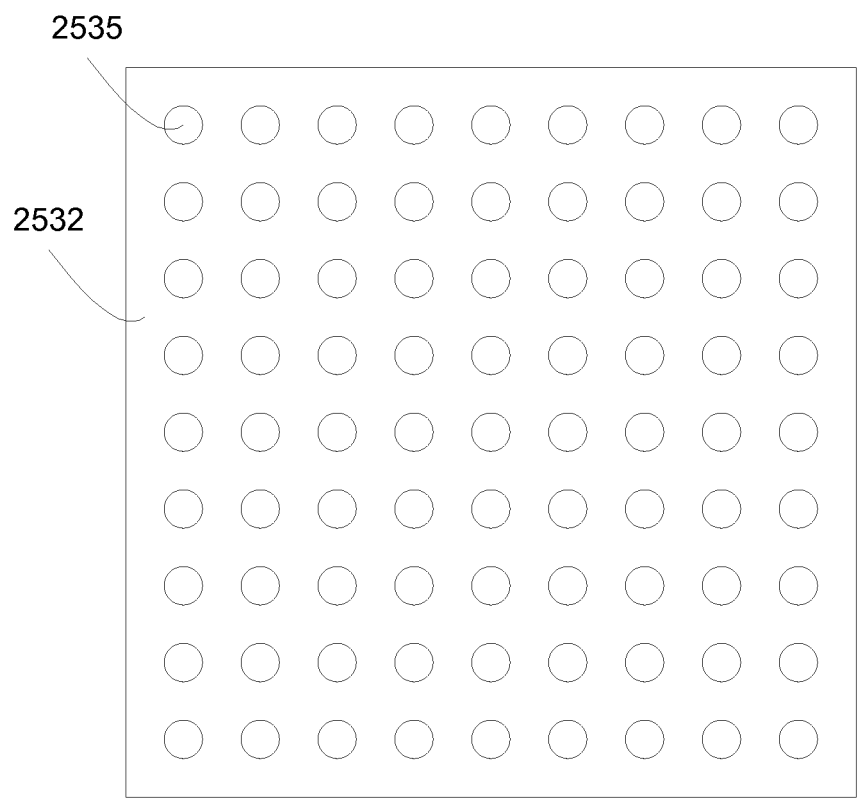

FIGS. 25A-25C illustrate a patterned silicon film having pillars according to some embodiments. In FIG. 25A, silicon pillars 2535 can be formed on layer 2532, which can be exfoliated from a porous silicon wafer as discussed above. In FIG. 25B, the layer 2532 can be cleaned to remove the rough surface, resulting in silicon pillars 2535 disposed on a silicon plate 2532. FIG. 25C shows a top view of the layer 2532 having the pillars 2535 disposed thereon.

Figure 26A:
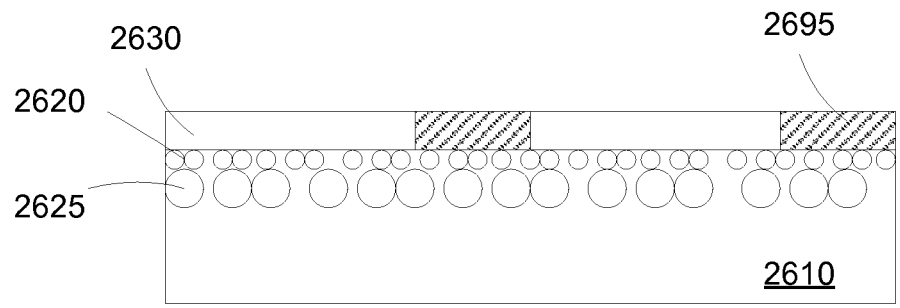
FIGS. 26A-26C illustrate another schematic process for patterning a silicon film according to some embodiments.
Figure 26B:
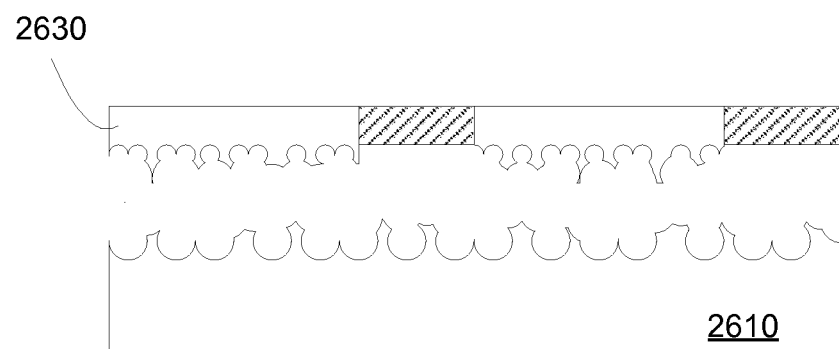
Figure 26C:
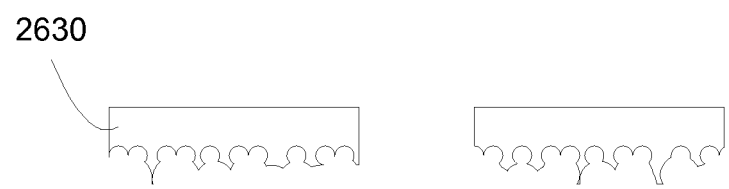

FIGS. 26A-26C illustrate another schematic process for patterning a silicon film according to some embodiments. In FIG. 26A, a single crystal silicon wafer 2610 can be provided. Two levels of pores 2620 and 2625 are formed on the silicon wafer 2610. A sacrificial layer, such as a carbon-containing layer such as a photoresist layer, can be formed on the wafer 2610, on top of the pores 2620 and 2625. The photoresist layer can be patterned, for example, by a photolithography process, to form pattern layer 2695. An epitaxial silicon layer 2630 is deposited on the wafer 2610. The deposition conditions can be selected to provide a selective deposition process, depositing silicon only on the exposed portion of the wafer 2610, and without deposition on the pattern layer 2695. The deposition conditions can include a silane deposition at a temperature above 500-1100 C. During the ramp up of temperature, the patterned photoresist 2695 can be burned off, leaving carbon patterned layer.

In FIG. 26B, the composite substrate, e.g., the epitaxial layer 2630 on the silicon wafer 2610 through the porous interface, can be subjected to a high temperature process, which can coalesce the pores and exfoliate the epitaxial layer 2630 from the wafer 2610. The exfoliated surface can be rough, or can be smooth, depending on the process condition. An optional cleaning process, such as an HF etch, can clean and smooth the exfoliated surface.

In FIG. 26C, the patterned layer 2695 can be removed, leaving a patterned epitaxial layer 2630. The epitaxial layer 2630 can be thick enough to be standing alone. The epitaxial layer 2630 can include the patterned of the carbon patterning layer 2695.

Figure 27A:
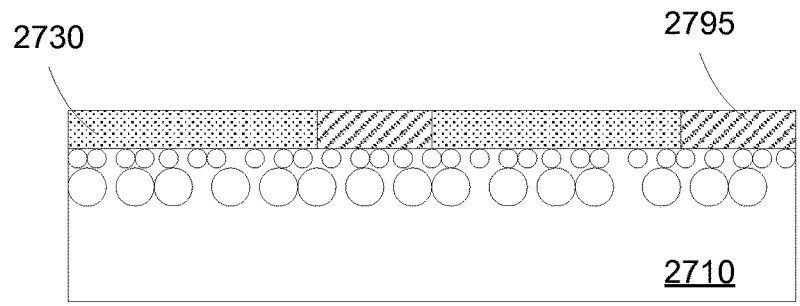
FIGS. 27A-27C illustrate a patterned silicon film having a serpentine pattern according to some embodiments.
Figure 27B:
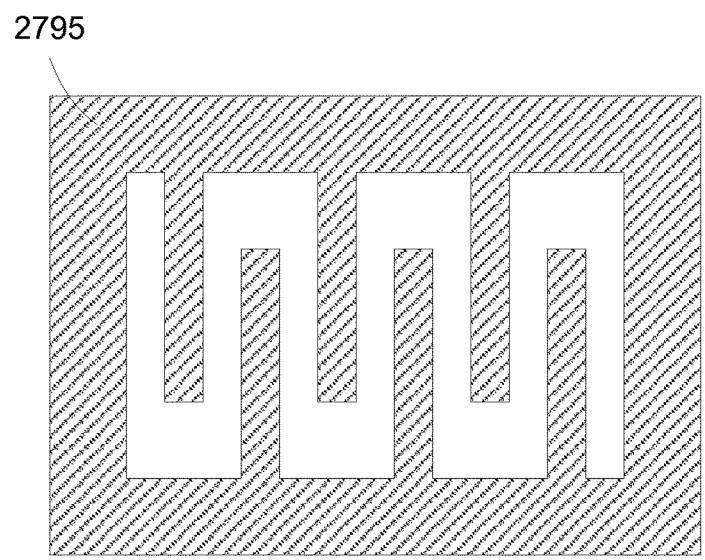
Figure 27C:
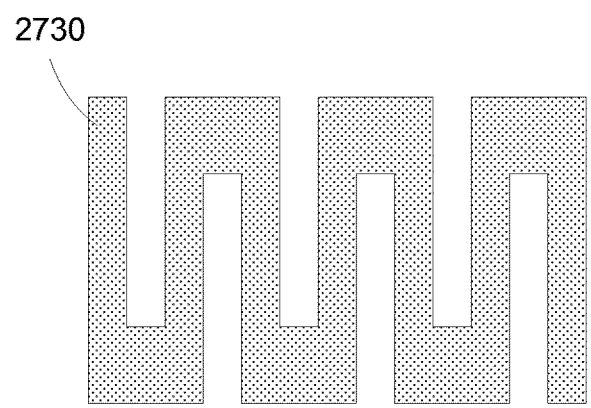

FIGS. 27A-27C illustrate a patterned silicon film having a serpentine pattern according to some embodiments. In FIG. 27A, serpentine silicon 2730 having patterned through pattern layer 2795 can be formed, which can be exfoliated from a porous silicon wafer as discussed above. The layer 2730 can be cleaned to remove the rough surface. FIG. 27B shows the pattern mask 2795, which can be formed on the silicon wafer 2710, so that the epitaxial layer 2730 can have the same pattern. FIG. 27C shows a top view of the silicon film 2730 having the serpentine pattern shown in the mask 2795.

Figure 28A:
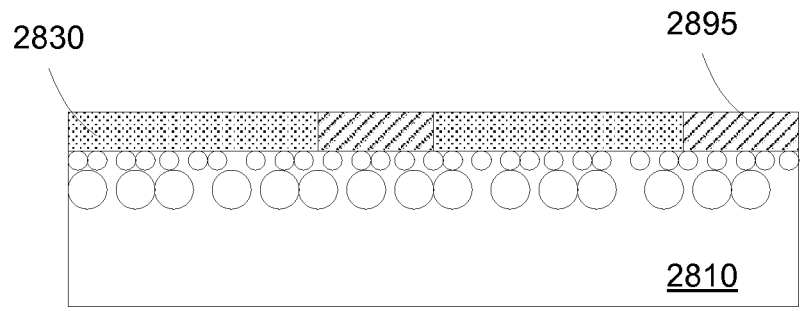
FIGS. 28A-28C illustrate a patterned silicon film having hole pattern according to some embodiments.
Figure 28B:
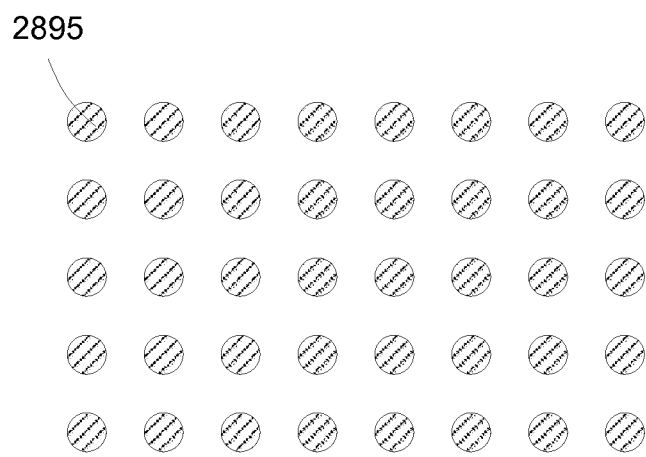
Figure 28C:
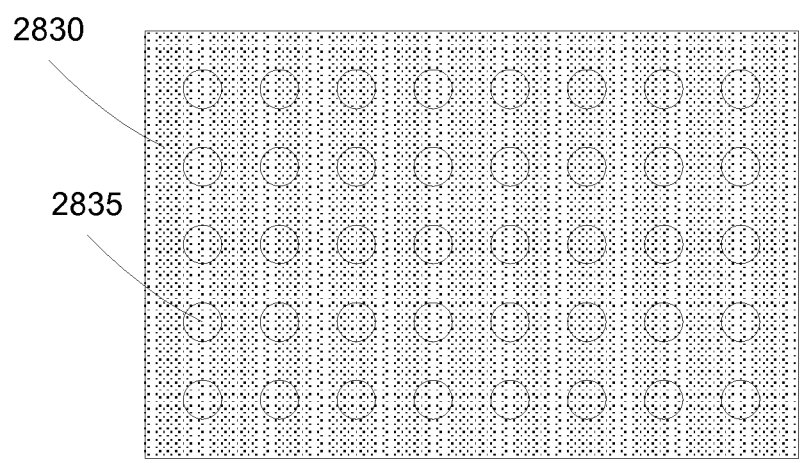

FIGS. 28A-28C illustrate a patterned silicon film having hole pattern according to some embodiments. In FIG. 28A, silicon layer 2830 having patterned through pattern layer 2895 can be formed, which can be exfoliated from a porous silicon wafer as discussed above. The layer 2830 can be cleaned to remove the rough surface. FIG. 28B shows the pattern mask 2895, which can be formed on the silicon wafer 2810, so that the epitaxial layer 2830 can have the same pattern. FIG. 28C shows a top view of the silicon film 2830 having the holes 2835 shown in the mask 2895.

What is claimed is:

1. A method comprising
providing a transparent substrate;
forming a layer of single crystal silicon on a portion of the transparent substrate;
forming a first device on the single crystal silicon layer, wherein the first device is configured to use the single crystal silicon layer as a first device channel;
forming a second device on the transparent substrate, wherein the second device is configured to use an amorphous or polycrystalline silicon layer as a second device channel;
forming a pixel on the transparent substrate, wherein the pixel is configured to be driven by the first device, wherein the first device is configured to supply a power to the pixel, wherein the pixel is configured to be switched by the second device, wherein the second device is configured to control the power supplied to the pixel.

2. A method as in claim 1
wherein the transparent substrate comprises a glass substrate.

3. A method as in claim 1
wherein forming a layer of single crystal silicon on the transparent substrate comprises exfoliating a portion of a single crystal substrate on the transparent substrate.

4. A method as in claim 1
wherein forming a layer of single crystal silicon on the transparent substrate comprises
ion implanting a single crystal silicon substrate to form ion implanted species in the single crystal silicon substrate;
bonding the ion implanted single crystal silicon substrate with the transparent substrate;
heating the bonded substrates to exfoliate a portion of the single crystal silicon substrate along the ion implanted species.

5. A method as in claim 4 further comprising
oxidizing the single crystal silicon substrate before ion implanting.

6. A method as in claim 4
wherein bonding the ion implanted single crystal silicon substrate with the transparent substrate comprises
cleaning the ion implanted single crystal silicon substrate and the transparent substrate;
attaching the ion implanted single crystal silicon substrate and the transparent substrate to form a bond.

7. A method as in claim 4
wherein bonding the ion implanted single crystal silicon substrate with the transparent substrate comprises
cleaning the ion implanted single crystal silicon substrate and the transparent substrate, wherein the cleaning is configured to form a layer of silicon oxide on the ion implanted single crystal silicon substrate;
attaching the ion implanted single crystal silicon substrate and the transparent substrate.

8. A method as in claim 1
wherein forming the first device comprises
forming a gate on the single crystal silicon layer;
forming source and drain in the single crystal silicon layer.

9. A method as in claim 1
wherein the second device is formed directly on the transparent substrate.

10. A method as in claim 1
wherein forming a layer of single crystal silicon on a portion of the transparent substrate comprises
forming the single crystal silicon layer on the transparent substrate;
removing a portion of the single crystal silicon layer.

11. A method as in claim 1
wherein forming the second device comprises
forming a gate on the transparent substrate;
forming an amorphous silicon layer on the gate;
forming source and drain on the amorphous silicon layer.

12. A method as in claim 1
wherein the pixel comprises an organic light emitting diode (OLED) pixel,
wherein the first device is configured to supply a current to the pixel,
wherein the second device is configured to control the current supplied to the pixel.

13. A method as in claim 1 further comprising
fabricating connections connecting the first device, the second device, and the pixel.

14. A method as in claim 1
wherein the first device is formed in a single crystal silicon layer on the transparent substrate.

15. A method as in claim 1
wherein the second device is formed on the transparent substrate.

16. A method as in claim 1
wherein the second device is formed on a single crystal silicon layer on the transparent substrate.

17. A method comprising
providing a transparent substrate;
forming a layer of single crystal silicon on the transparent substrate;
forming a first device on a first portion of the single crystal silicon layer, wherein the first device is configured to use the single crystal silicon layer as a first device channel;
forming a second device on a second portion of the single crystal silicon, wherein the second device is configured to use an amorphous or polycrystalline silicon layer as a second device channel;
forming a pixel on the transparent substrate, wherein the pixel is configured to be driven by the first device, wherein the pixel is configured to be switched by the second device.

18. A method as in claim 17
wherein the pixel comprises an organic light emitting diode (OLED) pixel,
wherein the first device is configured to supply a current to the pixel,
wherein the second device is configured to control the current supplied to the pixel.

19. A method as in claim 17
wherein the pixel comprises an organic light emitting diode (OLED) pixel,
wherein the first device is configured to supply a current to the pixel,
wherein the second device is configured to control the current supplied to the pixel.

20. A method comprising
providing a transparent substrate;
forming a first device on the transparent substrate, wherein the first device is configured to use the single crystal silicon layer as a first device channel, wherein the first device is configured to drive a display pixel;
forming a second device on the transparent substrate, wherein the second device is configured to use an amorphous or polycrystalline silicon layer as a second device channel, wherein the second device is configured to switch the display pixel.

* * * * *